United States Patent
Kubo et al.

(10) Patent No.: US 10,122,469 B2
(45) Date of Patent: *Nov. 6, 2018

(54) OPTICAL TRANSMITTER, ACTIVE OPTICAL CABLE, AND OPTICAL TRANSMISSION METHOD

(71) Applicant: Fujikura Ltd., Tokyo (JP)

(72) Inventors: Tatsuo Kubo, Sakura (JP); Osamu Kikuchi, Sakura (JP); Takayuki Tanaka, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/883,279

(22) Filed: Jan. 30, 2018

(65) Prior Publication Data

US 2018/0159633 A1    Jun. 7, 2018

Related U.S. Application Data

(63) Continuation of application No. 15/487,764, filed on Apr. 14, 2017, and a continuation of application No. PCT/JP2015/078958, filed on Oct. 13, 2015.

(30) Foreign Application Priority Data

Oct. 15, 2014    (JP) ................................ 2014-211226

(51) Int. Cl.
  *H04B 10/04*    (2006.01)
  *H04B 10/564*    (2013.01)
  (Continued)

(52) U.S. Cl.
  CPC ......... *H04B 10/564* (2013.01); *G02B 6/4292* (2013.01); *H01S 5/0427* (2013.01);
  (Continued)

(58) Field of Classification Search
  CPC ............ H04B 10/07955; H04B 10/071; H04B 10/25752; H04B 10/27; H04B 10/564;
  (Continued)

(56) References Cited

U.S. PATENT DOCUMENTS 4,347,498 A * 8/1982 Lee ..................... H04L 12/56
                                                    340/2.81
4,709,416 A    11/1987 Patterson
(Continued)

FOREIGN PATENT DOCUMENTS

CN    103688478 A    3/2014
JP    62-203436 A    9/1987
(Continued)

OTHER PUBLICATIONS

International Search Report dated Jan. 12, 2016, issued in counterpart International Application No. PCT/JP2015/078958 (2 pages).
(Continued)

*Primary Examiner* — Hibret Woldekidan
(74) *Attorney, Agent, or Firm* — Westerman, Hattori, Daniels & Adrian, LLP

(57) ABSTRACT

A connector which serves as an optical transmitter in accordance with an embodiment of the present invention includes: a transmitting circuit configured to convert a data signal into an electric current signal, the data signal being a three-valued; and an LD configured to convert the electric current signal into an optical signal. The transmitting circuit detects, as an IDLE interval, an interval during which the data signal falls within a predetermined range that is between a high level and a low level. The transmitting circuit controls, during the IDLE interval, the electric current signal to be not greater than a threshold electric current of the LD.

14 Claims, 17 Drawing Sheets

(51) Int. Cl.
*G02B 6/42* (2006.01)
*H04B 10/50* (2013.01)
*H01S 5/042* (2006.01)
*H04B 10/54* (2013.01)
*H01S 5/062* (2006.01)

(52) U.S. Cl.
CPC ......... *H04B 10/504* (2013.01); *H04B 10/505* (2013.01); *H04B 10/541* (2013.01); *H01S 5/06213* (2013.01); *H04B 10/5057* (2013.01)

(58) Field of Classification Search
CPC ............................ H04B 10/40; H04B 10/0775; H04B 10/0777; H04B 10/079; H04B 10/0795; H04B 10/1127; H04B 10/504; H04B 10/505; H04B 10/5057; H01S 5/0428; H01S 5/0427; H01S 5/06213; H04L 2007/045; G02B 6/4292
USPC .... 398/25, 38, 182, 183, 186, 192, 193, 197
See application file for complete search history.

(56) References Cited

U.S. PATENT DOCUMENTS

| | | | |
|---|---|---|---|
| 5,276,671 A | 1/1994 | Minami et al. | |
| 6,044,095 A | 3/2000 | Asano et al. | |
| 6,304,356 B1* | 10/2001 | Dubos | H04B 10/503 372/29.021 |
| 6,310,708 B1* | 10/2001 | Ota | H04B 10/0775 398/183 |
| 6,317,236 B1* | 11/2001 | Saunders | H04L 29/06 398/183 |
| 6,917,639 B2* | 7/2005 | Ishida | H01S 5/042 372/29.015 |
| 7,698,585 B2 | 4/2010 | Malik et al. | |
| 8,896,648 B2* | 11/2014 | Omori | G03G 15/043 347/130 |
| 9,559,655 B2* | 1/2017 | Uemura | H03G 3/3084 |
| 9,729,249 B2* | 8/2017 | Uemura | H04B 10/616 |
| 9,749,059 B2* | 8/2017 | Uemura | H01S 5/042 |
| 2002/0085599 A1 | 7/2002 | Schrodinger | |
| 2002/0106031 A1 | 8/2002 | Ebuchi et al. | |
| 2003/0025957 A1* | 2/2003 | Jayakumar | H04B 10/00 398/5 |
| 2003/0048512 A1 | 3/2003 | Ota | |
| 2005/0226490 A1 | 10/2005 | Phillips et al. | |
| 2006/0069930 A1 | 3/2006 | Dixon et al. | |
| 2007/0286609 A1* | 12/2007 | Ikram | H04B 10/564 398/197 |
| 2008/0169771 A1 | 7/2008 | Nakamura | |
| 2012/0113999 A1* | 5/2012 | Tanaka | H01S 5/0427 372/38.02 |
| 2012/0191887 A1 | 7/2012 | Yamauchi et al. | |
| 2014/0177739 A1 | 6/2014 | Matsudaira et al. | |
| 2014/0233594 A1 | 8/2014 | Kubo | |
| 2015/0163010 A1 | 6/2015 | Umeda | |
| 2015/0288293 A1* | 10/2015 | Siessegger | H05B 33/0803 315/246 |
| 2016/0087723 A1 | 3/2016 | Zhang et al. | |
| 2016/0285563 A1* | 9/2016 | Tanaka | H04B 10/69 |
| 2017/0222726 A1* | 8/2017 | Kubo | G02B 6/4292 |

FOREIGN PATENT DOCUMENTS

| | | |
|---|---|---|
| JP | 01-166582 A | 6/1989 |
| JP | 02-086341 A | 3/1990 |
| JP | 2-92031 A | 3/1990 |
| JP | 4-339328 A | 11/1992 |
| JP | 5-93066 U | 12/1993 |
| JP | 6-164497 A | 6/1994 |
| JP | 6-302883 A | 10/1994 |
| JP | 8-222794 A | 8/1996 |
| JP | 9-51305 A | 2/1997 |
| JP | 10-70329 A | 3/1998 |
| JP | 10-190118 A | 7/1998 |
| JP | 2000-232240 A | 8/2000 |
| JP | 2001-358400 A | 12/2001 |
| JP | 2002-305556 A | 10/2002 |
| JP | 2004-140626 A | 5/2004 |
| JP | 2004-249591 A | 9/2004 |
| JP | 2008-34460 A | 2/2008 |
| JP | 2008-98206 A | 4/2008 |
| JP | 2008-198983 A | 8/2008 |
| JP | 2011-182108 A | 9/2011 |
| JP | 2011-198865 A | 10/2011 |
| JP | 2011-205508 A | 10/2011 |
| JP | 2012-146041 A | 8/2012 |
| JP | 2013-153087 A | 8/2013 |
| JP | 2013-255037 A | 12/2013 |
| WO | 00/025458 A1 | 5/2000 |
| WO | 2013/060134 A1 | 4/2016 |
| WO | 2016/060133 A1 | 4/2016 |

OTHER PUBLICATIONS

Office Action dated Jun. 28, 2016, issused in counterpart Japanese application No. 2016-517586 (3 pages).
Office Action dated Jan. 10, 2017, issused in counterpart Japanese application No. 2016-517586 (3 pages).
Office Action dated Jan. 10, 2017, issused in counterpart Japanese application No. 2016-554088 (2 pages).
Office Action dated Apr. 4, 2017, issused in counterpart Japanese application No. 2016-517586, with English translation. (6 pages).
Notice of Allowance dated Jul. 25, 2017, issued in counterpart Japanese Application No. 2016-517586, with machine translation. (4 pages).
Notice of Allowance dated Jul. 25, 2017, issued in counterpart Japanese Application No. 2016-554088, with machine translation. (4 pages).
Notice of Allowance dated Sep. 5, 2017, issued in counterpart Japanese Application No. 2017-128054, with English translation (5 pages).
Extended European Search Report dated Oct. 5, 2017, issued in counterpart European Application No. 15851587.4. (8 pages).
U.S. Non-Final Office Action dated Dec. 14, 2017, issued in U.S. Appl. No. 15/487,764. (31 pages).
European Search Report dated May 4, 2018 in counterpart EP application No. 18152910.8.
Office Action dated Jun. 25, 2018, issued in counterpart European Application No. 15 851 587.4 (8 pages).
Notice of Allowance dated Jun. 8, 2018, issued in co-pending U.S. Appl. No. 15/487,764. (6 pages).

* cited by examiner

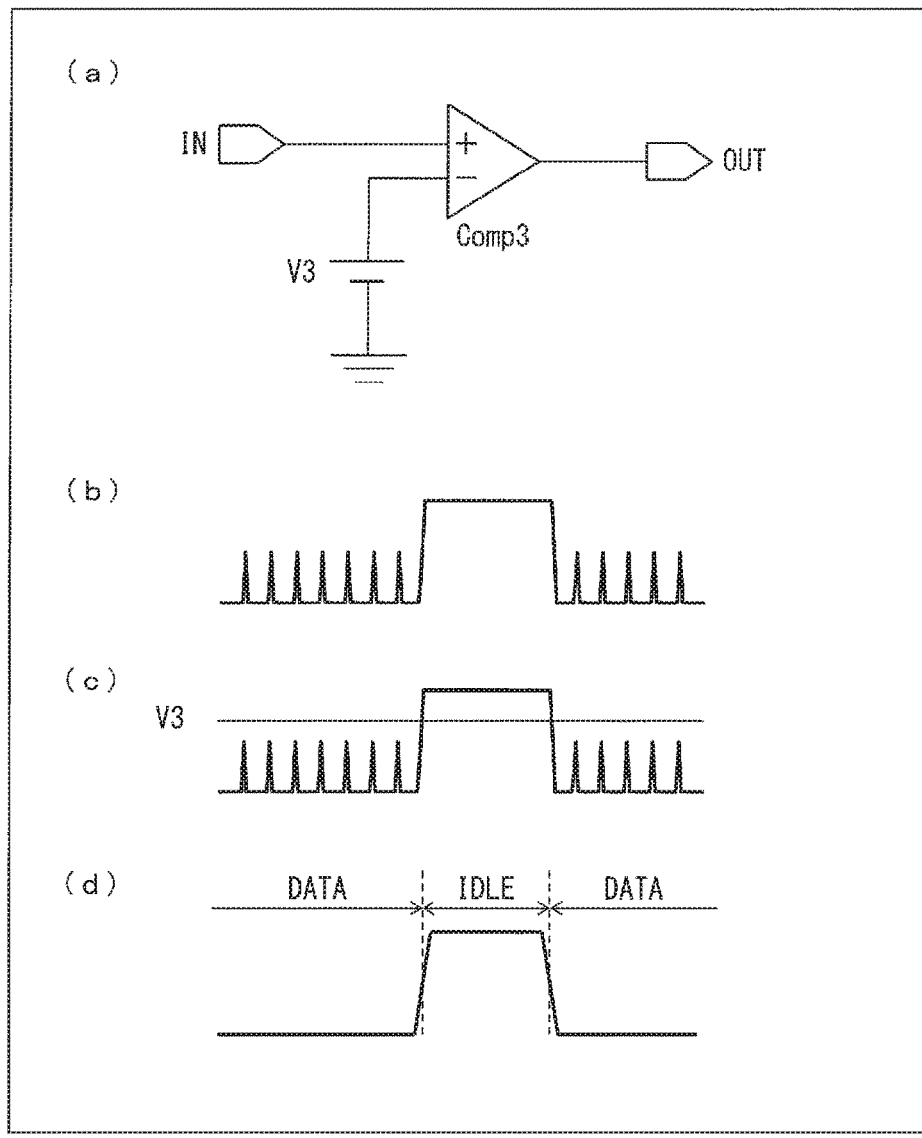

OPTICAL TRANSMITTER, ACTIVE OPTICAL CABLE, AND OPTICAL TRANSMISSION METHOD

CROSS-REFERENCE TO RELATED APPLICATIONS

This application is a continuation of U.S. application Ser. No. 15/487,764 filed on Apr. 14, 2017 which is a continuation of PCT International Application No. PCT/JP2015/078958 filed in Japan on Oct. 13, 2015, which claims the benefit of Patent Application No. 2014-211226 filed in Japan on Oct. 15, 2014, the entire contents of which are hereby incorporated by reference.

TECHNICAL FIELD

The present invention relates to (i) an optical transmitter which converts a data signal into an optical signal and then transmits the optical signal, (ii) a method thereof, and (iii) an active optical cable including a connector in which the optical transmitter is provided.

BACKGROUND ART

According to a serial communication in conformity to Serial Attached SCSI (SAS) 2.0, a negotiation using an out-of-band (OOB) signal is conducted before a data transfer is initiated. The OOB signal has a pattern composed of (i) a DATA interval during which the OOB signal alternates between a high level (voltage) and a low level (voltage) and (ii) an IDLE interval during which the OOB signal is kept at an intermediate level (voltage) that is between the high level and the low level. According to a serial communication in conformity to PCI Express (PCIe) 3.0, a negotiation using a signal similar to the OOB signal is conducted. Note that, in a case of the serial communication in conformity to PCIe 3.0, an IDLE interval, included in a signal which is transmitted or received while the negotiation is conducted, is alternatively referred to as an Electrical Idle (EI) interval.

Such a serial communication has been conventionally made with use of a metal cable 101 illustrated in FIG. 15. The metal cable 101 includes a cable 104 and connectors 102 and 103 which are provided at respective ends of the cable 104. The cable 104 houses a metal wire 107 which serves as a transmission medium. The connectors 102 and 103 include AC coupling capacitors 105 and 106, respectively. With use of such a metal cable 101, it is possible for the connector 103 to output a voltage signal having a waveform identical to that of a data signal supplied to the connector 102, even in a case where the data signal is an OOB signal or the like (including a signal such as a signal having a pattern which is composed of (i) a DATA interval used in PCIe 3.0 and (ii) an EI interval, which signal is similar to an OOB signal used in SAS 2.0. The same explanation applies to the following descriptions.)

CITATION LIST

[Patent Literature]
[Patent Literature 1]
 Japanese Patent Application Publication Tokukai No. 2000-232240 (Publication Date: Aug. 22, 2000)
[Patent Literature 2]
 Japanese Patent Application Publication Tokukai No. 2008-98206 (Publication Date: Apr. 24, 2008)
[Patent Literature 3]
 Japanese Patent Application Publication Tokukai No. 2011-182108 (Publication Date: Sep. 15, 2011)
[Patent Literature 4]
 Japanese Patent Application Publication Tokukaihei No. 8-222794 (1996) (Publication Date: Aug. 30, 1996)
[Patent Literature 5]
 Japanese Patent Application Publication Tokukai No. 2013-255037 (Publication Date: Dec. 19, 2013)

SUMMARY OF INVENTION

Technical Problem

It has been currently considered to make a serial communication, which is in conformity to a standard such as SAS 2.0 or PCIe 3.0, by using an active optical cable 201 illustrated in (a) of FIG. 16.

The active optical cable 201 includes a cable 204 and connectors 202 and 203 which are provided at respective ends of the cable 204. The cable 204 houses an optical fiber 211 which serves as a transmission medium. The connector 202 includes an AC coupling capacitor 205, a transmitting circuit 206, and a laser diode (LD) 207. The connector 203 includes a photo diode (PD) 208, a receiving circuit 209, and an AC coupling capacitor 210. For example, light emitting element driving circuits disclosed in Patent Literatures 1 and 2 have been known as a light emitting element driving circuit which can be employed as the transmitting circuit 206.

In a case where a serial communication, which is in conformity to a standard such as SAS 2.0 or PCIe 3.0, is made by using the active optical cable 201 illustrated in (a) of FIG. 16, the following problems will occur. That is, in a case where a data signal supplied to the connector 202 is an OOB signal or the like, it is not possible for the connector 203 to output a voltage signal having a waveform identical to that of the data signal supplied to the connector 202. This is because, as illustrated in (b) of FIG. 16, the data signal supplied to the connector 202 is at an intermediate level (voltage) during an IDLE interval. This causes an optical signal outputted from the connector 202a to be at an indefinite value (light intensity) (see (c) of FIG. 16).

Note that, even in a case where a driving electric current which is to be supplied, during an IDLE interval, to the LD 207 in the connector 202 is fixed in amplitude, a photo-electric current which is to be supplied, during an IDLE interval, to the PD 208 in the connector 203 has an indefinite amplitude. This is because (i) an electro-optical conversion efficiency of the LD 207 and an opto-electrical conversion efficiency of the PD 208 can fluctuate in accordance with, for example, a temperature change and (ii) a loss in the optical fiber 211 can also fluctuate due to, for example, warping of the optical fiber 211. As such, it is not possible for the connector 203 to correctly identify, based on a threshold processing or the like, an IDLE interval during which a data signal supplied to the connector 202 is kept at an intermediate level. Therefore, in a case where a data signal supplied to the connector 202 is an OOB signal or the like, it is difficult to reproduce, in the connector 203, a voltage signal having a waveform identical to that of the data signal supplied to the connector 202.

The present invention has been attained to address the above problems, and an object of the present invention is to provide an optical transmitter which converts a data signal into an optical signal and then transmits the optical signal and which allows an optical receiver to correctly identify an IDLE interval of the optical signal transmitted from the optical transmitter. Another object of the present invention is to provide an active optical cable which can be used to make a serial communication which requires an OOB signal or the like to be transmitted and received through the use of such an optical transmitter.

Note that, according to a passive optical network (PON) system, (i) an optical network unit (ONU) (corresponding to the connector 202 of the active optical cable 201) at a transmitting end stops an operation of an LD in response to a burst enable (BEN) signal (referred to also as a "transmission enable signal") which is externally supplied together with a data signal and (ii) an ONU (corresponding to the connector 203 of the active optical cable 201) at a receiving end identifies a no-signal interval (corresponding to the IDLE interval in the active optical cable 201). Patent Literature 3 discloses a burst-mode laser driving circuit which is employed in such a PON system. The burst laser driving circuit disclosed in Patent Literature 3, however, cannot address the above objects because a serial communication in conformity to SAS 2.0 or PCIe 3.0 does not employ a signal corresponding to a BEN signal.

Solution to Problem

In order to attain the above object, an optical transmitter in accordance with an embodiment of the present invention includes: a transmitting circuit configured to convert a data signal into an electric current signal, the data signal being a three-valued signal; and a light emitting element configured to convert the electric current signal into an optical signal, the transmitting circuit including an IDLE detection circuit which is configured to detect, as an IDLE interval, an interval during which the data signal falls within a predetermined range that is between a high level and a low level, the transmitting circuit being configured to control, during the IDLE interval, the electric current signal to be not greater than a threshold electric current of the light emitting element.

In order to attain the above object, a method of transmitting light in accordance with an embodiment of the present invention includes the steps of: (a) converting a data signal into an electric current signal, the data signal being a three-valued signal; and (b) converting the electric current signal into an optical signal with use of a light emitting element, the step (a) including the steps of: detecting, as an IDLE interval, an interval during which the data signal falls within a predetermined range that is between a high level and a low level; and controlling, during the IDLE interval, the electric current signal to be not greater than a threshold electric current of the light emitting element.

Note that an active optical cable including a connector in which the optical transmitter is provided is also encompassed in the scope of the present invention.

Advantageous Effects of Invention

An aspect of the present invention makes it possible to provide an optical transmitter which transmits an optical signal and which allows an optical receiver to correctly identify an IDLE interval of an optical signal transmitted from the optical transmitter.

BRIEF DESCRIPTION OF DRAWINGS (a) of FIG. 1 is a block diagram illustrating a configuration of an active optical cable including an optical transmitter in accordance with an embodiment of the present invention. (b) of FIG. 1 is a waveform chart of a data signal to be supplied to a connector of the active optical cable. (c) of FIG. 1 is a waveform chart of an optical signal to be outputted from the connector.

Figure 16:
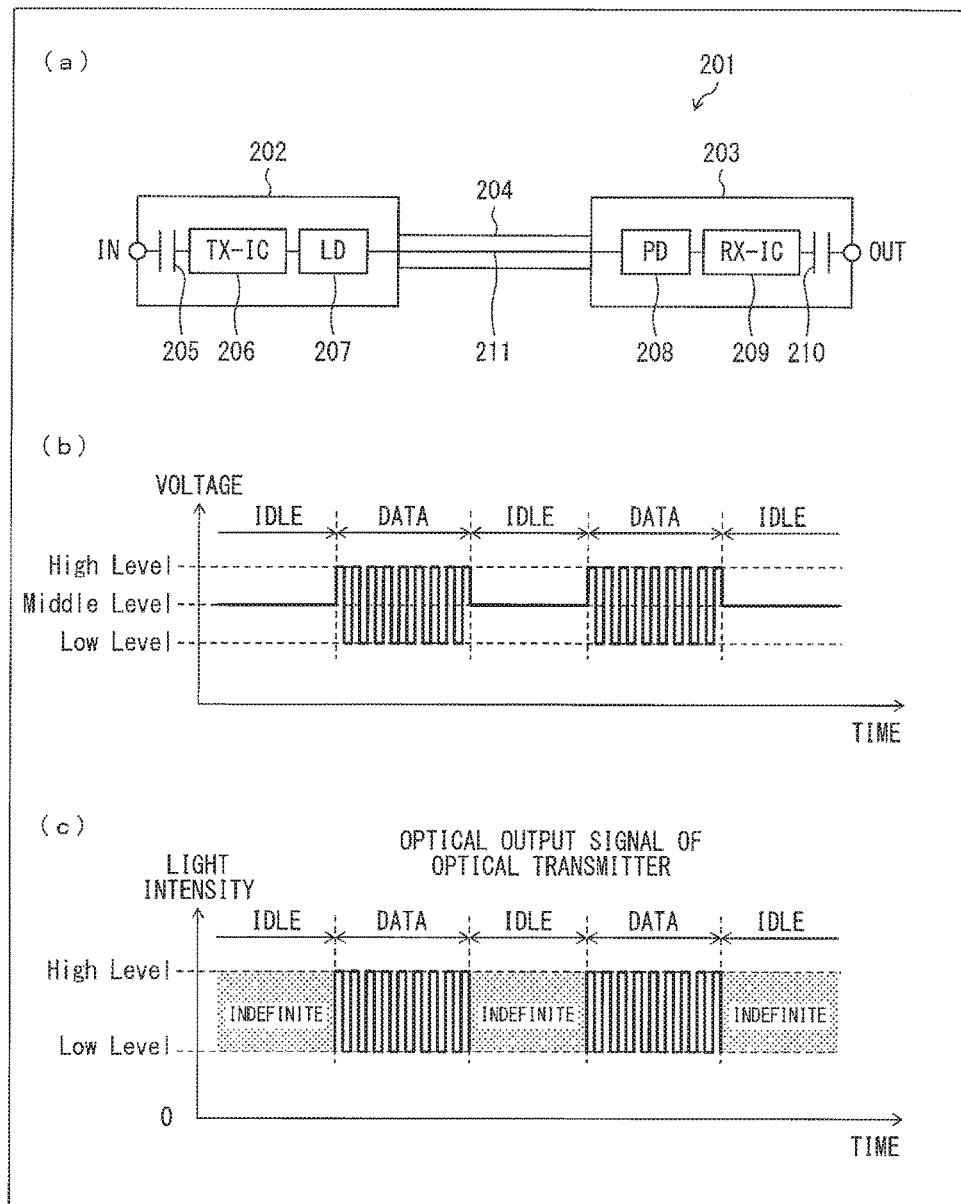

(a) of FIG. 16 is a block diagram illustrating a configuration of an active optical cable according to a conventional technique. (b) of FIG. 16 is a waveform chart of a data signal to be supplied to a connector included in the active optical cable. (c) of FIG. 16 is a waveform chart of an optical signal to be outputted from the connector.

Figure 5:
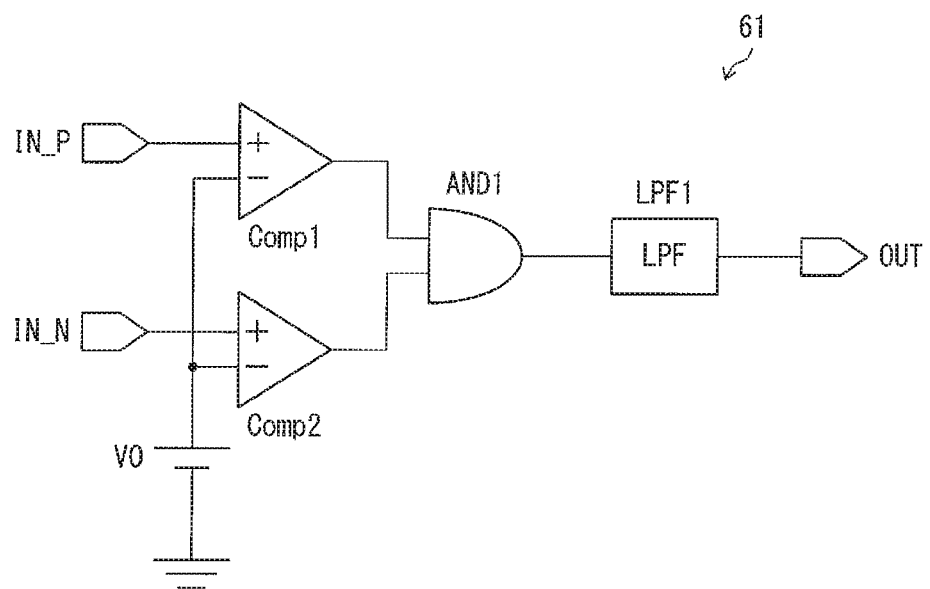
FIG. 5 is a circuit diagram illustrating an example configuration of an IDLE detection circuit included in the transmitting circuit illustrated in FIG. 2.
Figure 17:
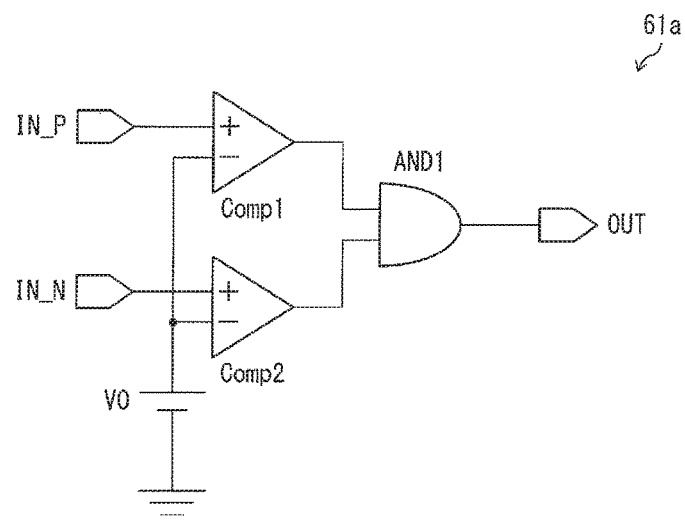

FIG. 17 is a circuit diagram illustrating a first variation of the IDLE detection circuit illustrated in FIG. 5.

Figure 18:
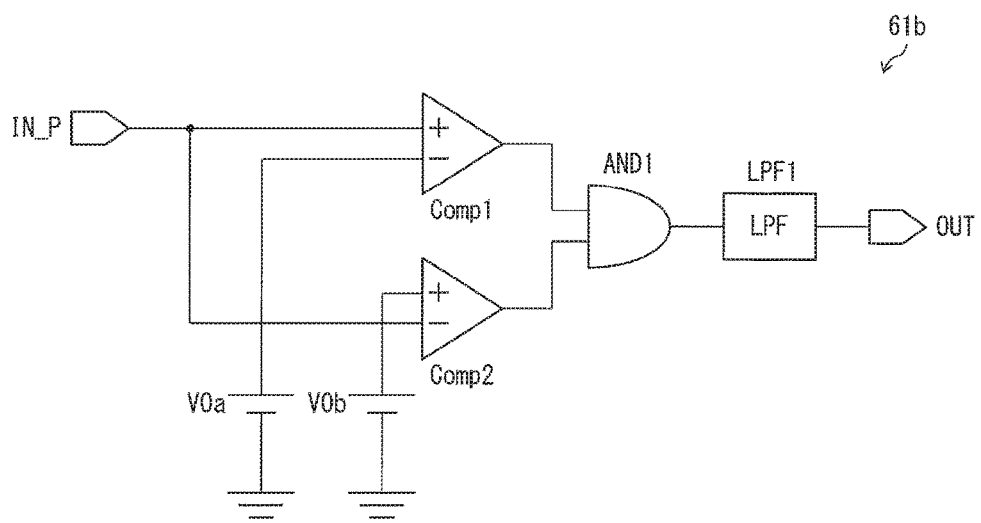

FIG. 18 is a circuit diagram illustrating a second variation of the IDLE detection circuit illustrated in FIG. 5.

Figure 19:
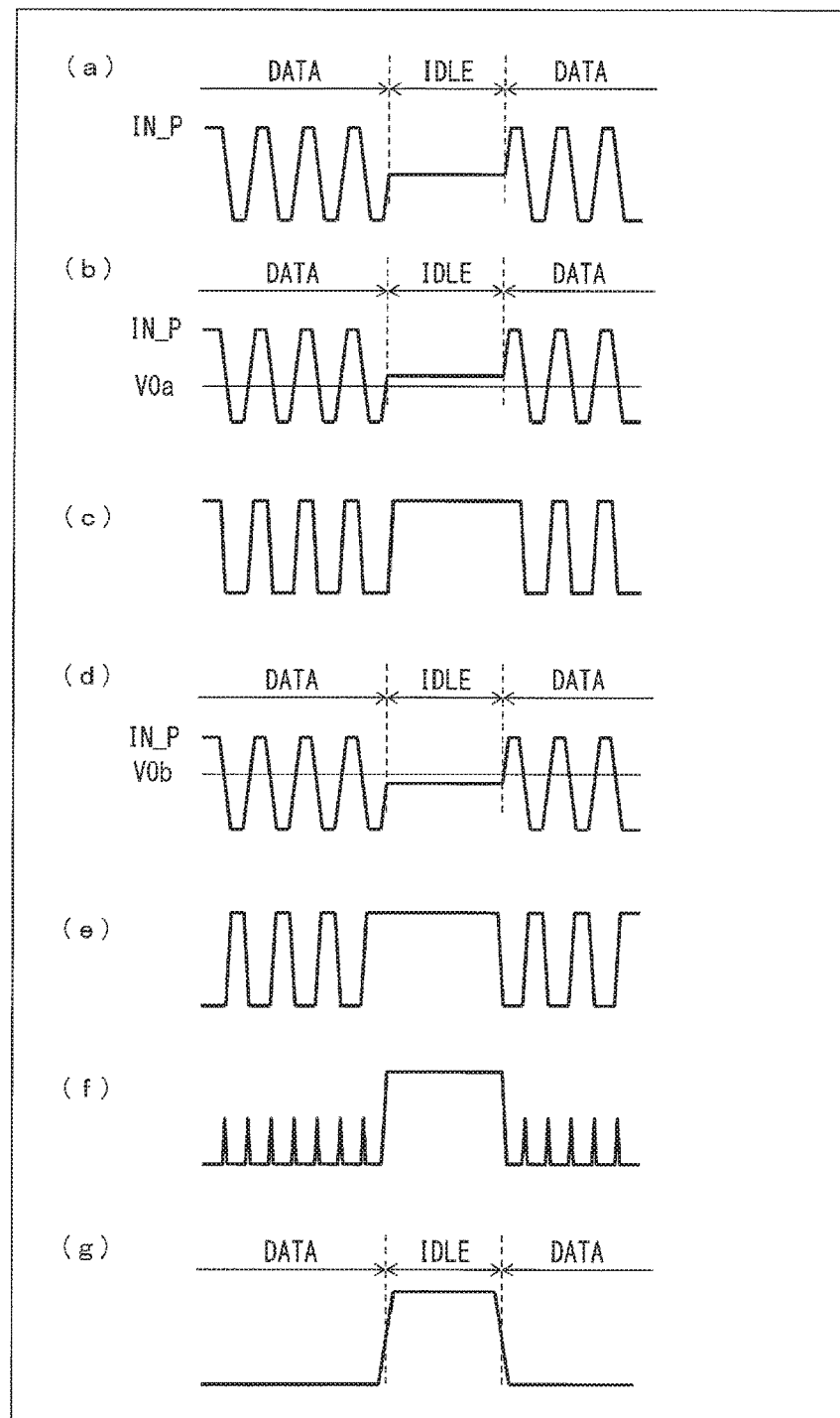

FIG. 19 is a waveform chart of a voltage signal in each section of the IDLE detection circuit illustrated in FIG. 18.

Figure 20:
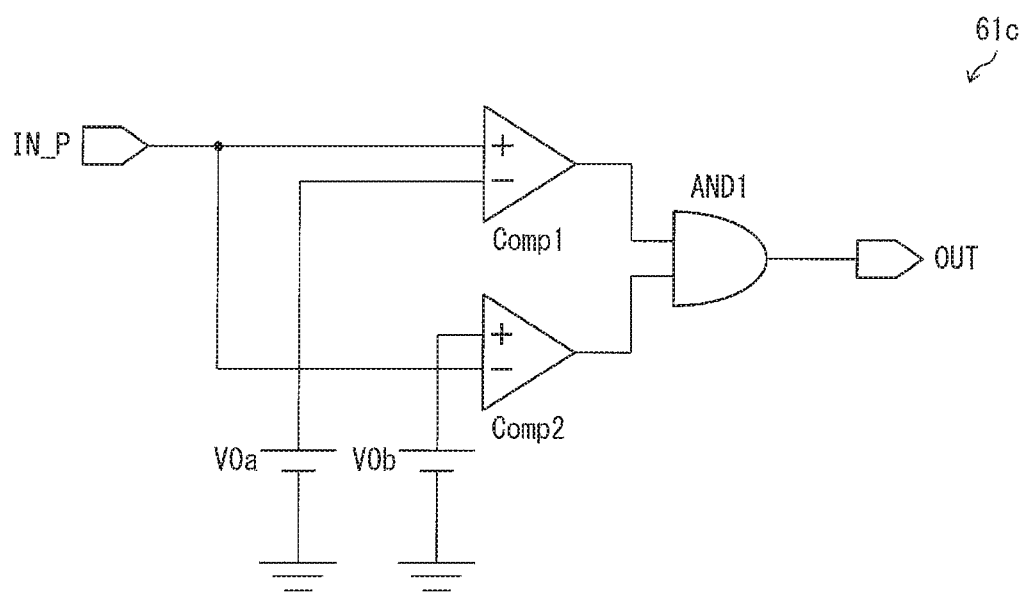

FIG. 20 is a circuit diagram illustrating a third variation of the IDLE detection circuit illustrated in FIG. 5.

(a) of FIG. 21 is a circuit diagram illustrating a comparator which can be employed instead of a low-pass filter included in (i) the IDLE detection circuit illustrated in FIG. 5 or (ii) the IDLE detection circuit illustrated in FIG. 18. Each of (b) through (d) of FIG. 21 is a waveform chart of a voltage signal in each section of the comparator.

DESCRIPTION OF EMBODIMENTS

[Active Optical Cable]

Figure 1:
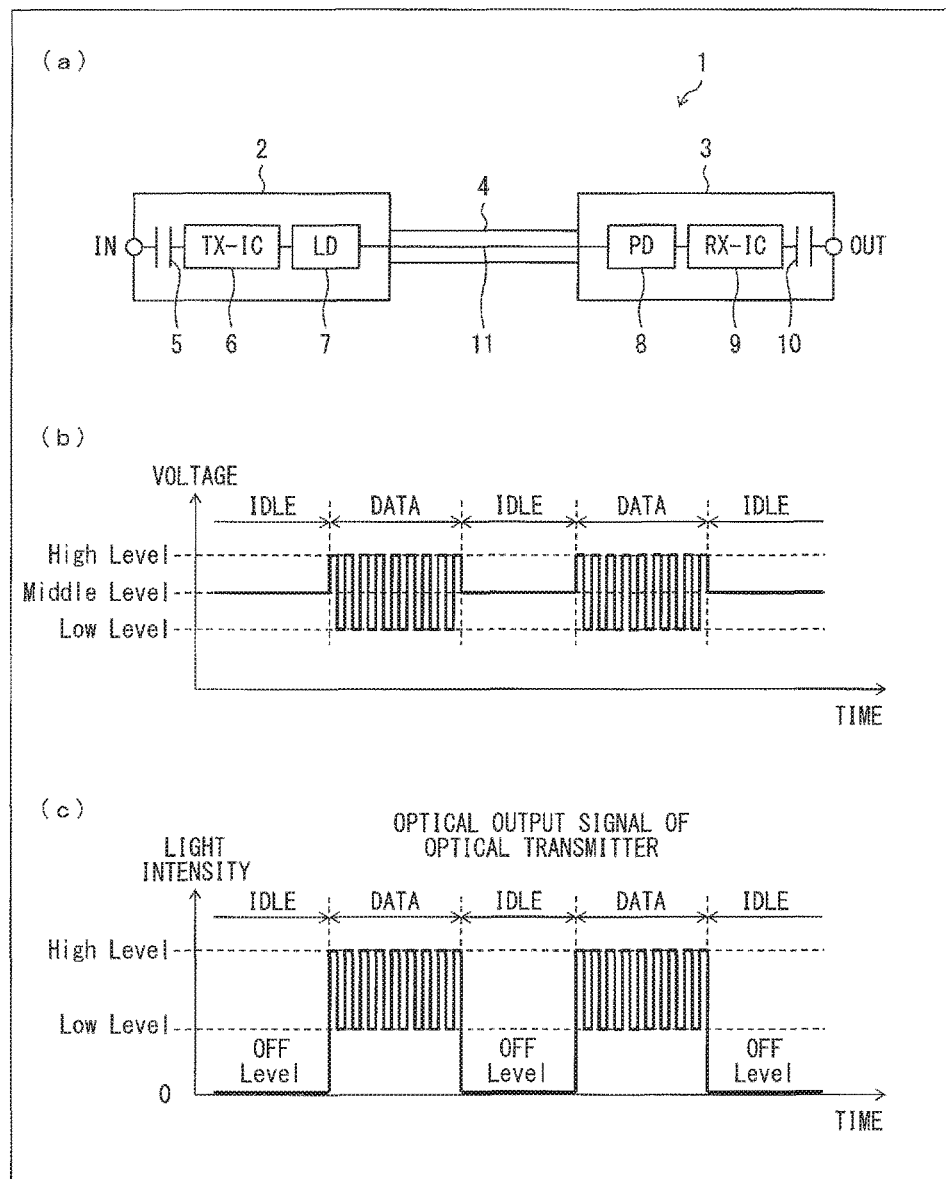

The following description will discuss, with reference to FIG. 1, an active optical cable 1, which includes an optical transmitter, in accordance with an embodiment of the present invention.

(a) of FIG. 1 is a block diagram illustrating a configuration of the active optical cable 1. As illustrated in (a) of FIG. 1, the active optical cable 1 includes (i) a cable 4 and (ii) a pair of connectors 2 and 3 which are provided at respective ends of the cable 4. The cable 4 houses an optical fiber 11.

The connector 2 includes an AC coupling capacitor 5, a transmitting circuit 6, and a laser diode (LD) 7. The connector 2 serves as an optical transmitter which converts a data signal (voltage signal) into an optical signal and then transmits the optical signal thus converted. The transmitting circuit 6 converts, into an electric current signal, a data signal externally supplied (e.g., supplied from a host device) through the AC coupling capacitor 5. The electric current signal thus converted is supplied to the LD 7. The LD 7 converts, into an optical signal, the electric current signal thus supplied from the transmitting circuit 6. The optical signal thus converted is transmitted to the connector 3 through the optical fiber 11.

In the active optical cable 1, the transmitting circuit 6 is realized by, for example, an integrated circuit. As such, the transmitting circuit 6 is indicated as "TX-IC" in (a) of FIG. 1. Note that the transmitting circuit 6 is not limited as such. Alternatively, the transmitting circuit 6 can be realized by, for example, a discrete circuit. The AC coupling capacitor 5 can be omitted. The LD 7 can be replaced by a light emitting element (e.g., a light emitting diode) other than an LD.

The connector 3 includes a photodiode (PD) 8, a receiving circuit 9, and an AC coupling capacitor 10. The connector 3 serves as an optical receiver which converts an optical signal into a data signal and outputs the data signal thus converted. The PD 8 converts, into an electric current signal, an optical signal supplied from the connector 2. The electric current signal thus converted is supplied to the receiving circuit 9. The receiving circuit 9 converts, into a data signal (voltage signal), the electric current signal thus supplied from the PD 8. The data signal thus converted is outputted outside the active optical cable 1 (e.g., outputted to a host device), through the AC coupling capacitor 10.

Note that according to the active optical cable 1, the receiving circuit 9 is realized by, for example, an integrated circuit. The receiving circuit 9 is therefore indicated by "RX-IC" in (a) of FIG. 1. Note that the receiving circuit 9 is not limited as such. Alternatively, the receiving circuit 9 can be realized by, for example, a discrete circuit. The AC coupling capacitor 10 can be omitted. The PD 8 can be replaced by a light receiving element (e.g., a phototransistor) other than a PD.

(b) of FIG. 1 is a waveform chart of a data signal to be supplied to the connector 2. The data signal to be supplied to the connector 2 is a three-valued voltage signal which has (i) a DATA interval during which the three-valued voltage signal alternates between a high level and a low level and (ii) an IDLE interval during which the three-valued voltage signal is kept at an intermediate level that is between the high level and the low level (see (b) of FIG. 1).

The transmitting circuit 6 included in the connector 2 has an IDLE detection circuit 61 (see FIG. 2) which detects an IDLE interval of the data signal. The transmitting circuit 6 operates as follows. That is, (i) during an interval other than an IDLE interval (i.e., during a DATA interval), The transmitting circuit 6 controls an electric current signal, which is to be supplied to the LD 7, to have a logical value (amplitude of a driving electric current) identical to that of the data signal whereas (ii) during an IDLE interval, The transmitting circuit 6 controls an electric current signal, which is to be supplied to the LD 7, to be not greater than a threshold electric current (oscillation inception current) of the LD 7 (to be 0 [A] in the present embodiment).

(c) of FIG. 1 is a waveform chart of an optical signal outputted from the connector 2. As illustrated in (c) of FIG. 1, (i) during an interval other than an IDLE interval (i.e., during a DATA interval), an optical signal outputted from the connector 2 alternates between a high level and a low level whereas (ii) during the IDLE interval, the optical signal is at an off level. Note that the off level refers to a level which is different from each of the high level and the low level and which rarely fluctuates in response to an external factor. Accordingly, by identifying an interval during which a received optical signal is at an off level, the connector 3 can correctly identify an IDLE interval of a data signal which has been supplied to the connector 2.

Note that the active optical cable 1 can include a configuration in which an optical signal is transmitted from the connector 3 to the connector 2, in addition to a configuration in which an optical signal is transmitted from the connector 2 to the connector 3. With the configurations, (i) an AC coupling capacitor 5', a transmitting circuit 6', and an LD 7' (not illustrated) are included in the connector 3, (ii) a PD 8', a receiving circuit 9', and an AC coupling capacitor 10' are included in the connector 2, and (iii) the LD 7' and the PD 8' are connected to each other via an optical fiber 11' (not illustrated). This makes it possible to make a bidirectional communication.

[Transmission Circuit]

Figure 2:
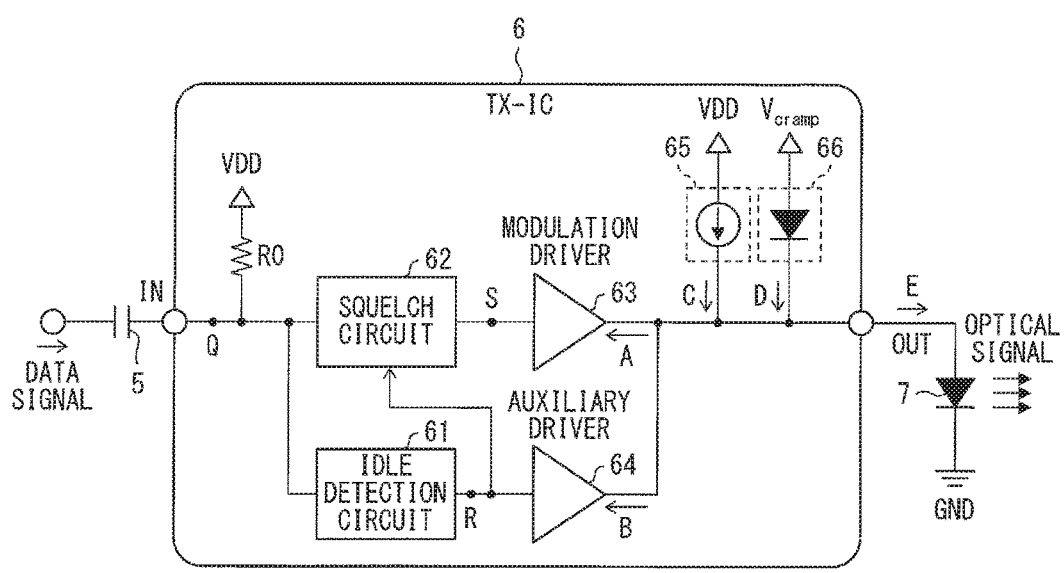
FIG. 2 is a block diagram illustrating an example configuration of a transmitting circuit included in the active optical cable illustrated in FIG. 1.
Figure 3:
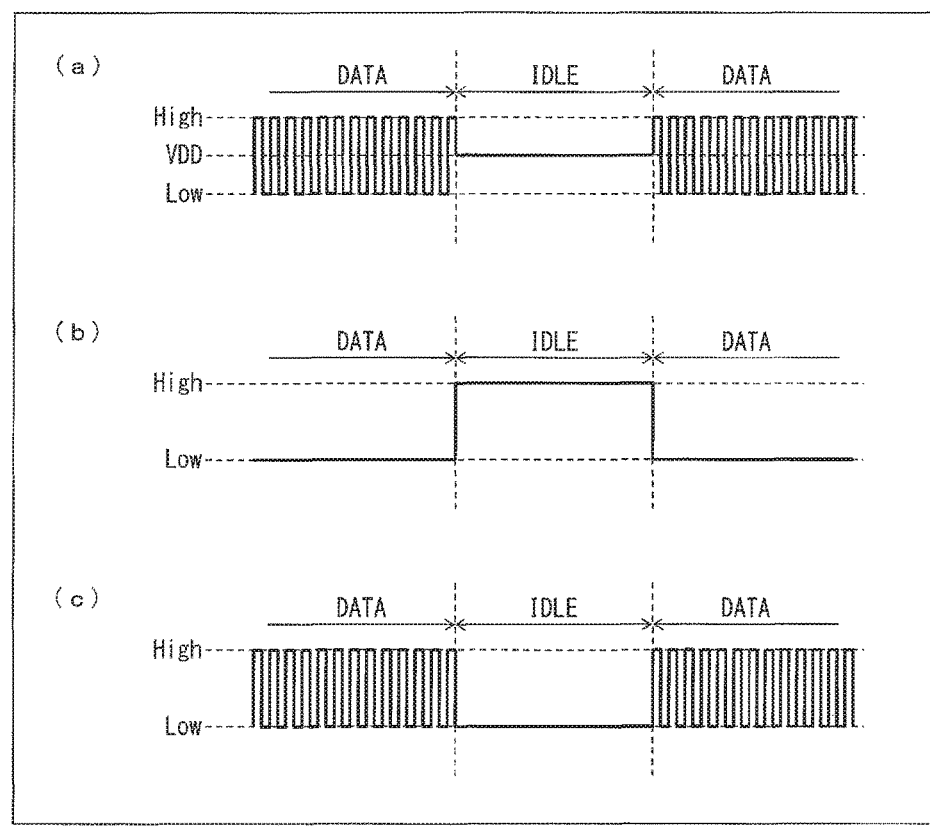
FIG. 3 is a waveform chart of a voltage signal in each section of the transmitting circuit illustrated in FIG. 2.
Figure 4:
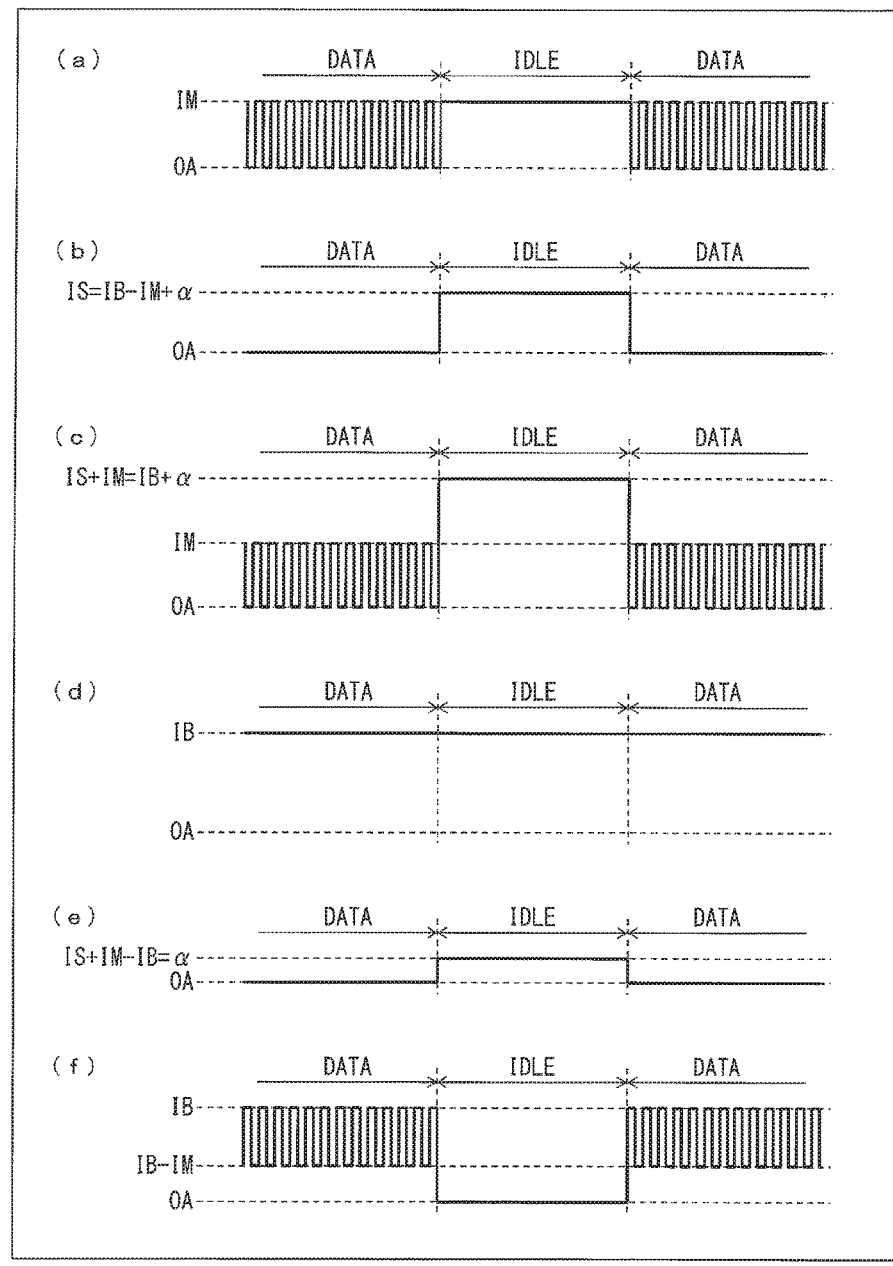
FIG. 4 is a waveform chart of an electric current signal in each section of the transmitting circuit illustrated in FIG. 2.

The following description will discuss, with reference to FIGS. 2 through 4, the transmitting circuit 6 which has been discussed. FIG. 2 is a block diagram illustrating an example configuration of the transmitting circuit 6. (a) through (c) of FIG. 3 are each a waveform chart of a voltage signal in each section of the transmitting circuit 6. (a) through (f) of FIG. 4 are each a waveform chart of an electric current signal in each section of the transmitting circuit 6.

As illustrated in FIG. 2, the transmitting circuit 6 includes an IDLE detection circuit 61, a squelch circuit 62, a modulation driver 63, an auxiliary driver 64, a bias electric current source 65, and a compensating electric current source 66.

The IDLE detection circuit 61 detects, as an IDLE interval, an interval (time zone) during which a data signal falls within a predetermined range that is between a high level and a low level. More specifically, the IDLE detection circuit 61 includes (i) a first comparator which identifies a first interval during which the data signal is not smaller than a lower limit value of the predetermined range and (ii) a second comparator which identifies a second interval during which the data signal is not greater than an upper limit value of the predetermined range. The IDLE detection circuit 61 detects, as the IDLE interval, an interval during which the first interval and the second interval overlap each other. Further, the IDLE detection circuit 61 creates an IDLE detection signal indicative of the IDLE interval. Note here that the IDLE detection signal created by the IDLE detection circuit 61 is a voltage signal which is at a high level during the IDLE interval and which is at a low level during an interval other than the IDLE interval (during a DATA interval). For example, in a case where the data signal has a waveform in which an electric potential at a point Q changes over time as shown in (a) of FIG. 3, the IDLE detection signal has a waveform in which an electric potential at a point R changes over time as shown in (b) of FIG. 3. The IDLE detection signal, created by the IDLE detection circuit 61, is supplied to each of the squelch circuit 62 and the auxiliary driver 64. Example configurations of the IDLE detection circuit 61 will be discussed later with reference to different drawings.

Note that the data signal is supplied to the transmitting circuit 6 through the AC coupling capacitor 5. This is why an intermediate level of the data signal shown in (a) of FIG. 3 coincides with a power source voltage VDD of the transmitting circuit 6.

The squelch circuit 62 identifies the IDLE interval with reference to the IDLE detection signal. The squelch circuit 62 corrects, during the IDLE interval, the data signal to be at a low level. That is, during the IDLE interval, the squelch circuit 62 outputs, irrespective of the data signal which has not been corrected, the low level as the data signal which has been corrected. Whereas, during an interval other than the IDLE interval (during a DATA interval), the squelch circuit 62 outputs, as the data signal which has been corrected, the data signal which has not been corrected. In a case where (i) the data signal which has not been corrected has a waveform as shown in (a) of FIG. 3 and (ii) an IDLE detection signal has a waveform as shown in (b) of FIG. 3, the data signal, which has been corrected, has a waveform in which an electric potential at a point S changes over time as shown in (c) of FIG. 3. The data signal, corrected by the squelch circuit 62, is supplied to the modulation driver 63. The data signal, corrected by the squelch circuit 62, is hereinafter referred to as "corrected data signal."

By drawing in, from the bias electric current source 65, a modulation electric current A which changes in accordance with a corrected data signal, the modulation driver 63 modulates, with reference to the corrected data signal, a bias electric current C supplied from the bias electric current source 65. More specifically, in a case where the corrected data signal is at a low level, the modulation driver 63 draws in the modulation electric current A, having a predetermined amplitude (IM[A]), from the bias electric current source 65. In a case where the corrected data signal is at a high level, the modulation driver 63 halts drawing in the modulation electric current A. In a case where the corrected data signal has a waveform as shown in (c) of FIG. 3, the modulation electric current A changes over time as shown in (a) of FIG. 4. An example configuration of the modulation driver 63 will be later discussed with reference to different drawings.

The auxiliary driver 64 identifies an IDLE interval with reference to the IDLE detection signal. The auxiliary driver 64 draws in, during the IDLE interval, an auxiliary electric current B, having a predetermined amplitude (IS[A]), from the bias electric current source 65. The auxiliary electric current B, which the auxiliary driver 64 draws in during the IDLE interval, is set to have an amplitude IS which satisfies IS=IB−IM+α so that IM+IS>IB is satisfied, where (i) IM indicates an amplitude of the modulation electric current A which the modulation driver 63 draws in during the IDLE interval, (ii) IB indicates an amplitude of the bias electric current C which the bias electric current source 65 outputs, and (iii) α indicates a positive constant number. In a case where the IDLE detection signal has a waveform as shown in (b) of FIG. 3, the auxiliary electric current B changes over time as shown in (b) of FIG. 4. As such, a composite electric current A+B, which results from combining the modulation electric current A and the auxiliary electric current B, changes over time as shown in (c) of FIG. 4. An example configuration of the auxiliary driver 64 will be later discussed with reference to different drawings.

The bias electric current source 65 outputs the bias electric current C having a predetermined amplitude (IB [A]). The bias electric current C changes over time as shown in (d) of FIG. 4. As discussed above, a part of the bias electric current C, which is outputted by the bias electric current source 65, is drawn in, as the modulation electric current A and the auxiliary electric current B, by the respective modulation driver 63 and auxiliary driver 64. The rest of the bias electric current C, which is outputted by the bias electric current source 65, is supplied as a driving electric current E to the LD 7 through an output terminal OUT. That is, the driving electric current E is supplied to the LD 7. The driving electric current E results from subtracting the auxiliary electric current B from a difference between the bias electric current C and the modulation electric current A.

Note that the bias electric current source 65 can be realized by, for example, a direct current source whose one end is connected to a power source (voltage VDD) and whose other end is connected to an output terminal OUT (see FIG. 2). Another example configuration of the bias electric current source 65 will be later discussed with reference to different drawings.

In a case where the composite electric current A+B (where the modulation electric current A has an amplitude IM[A] during the IDLE interval) exceeds the bias electric current C, the compensating electric current source 66 supplies, to the auxiliary driver 64, a compensating electric current D which compensates for an insufficiency of the bias electric current C. In a case where (i) the composite electric current A+B changes over time as shown in (c) of FIG. 4 and (ii) the bias electric current C changes over time as shown in (d) of FIG. 4, the compensating electric current D changes over time as shown in (e) of FIG. 4. It follows that the compensating electric current source 66 outputs, during the IDLE interval, the compensating electric current D which satisfies IM+IS−IB=α[A]. Accordingly, the driving electric current E, which is to be supplied to the LD 7 through the output terminal OUT, changes over time as shown in (f) of FIG. 4.

In a case where no compensating electric current source 66 is provided, an insufficiency of the bias electric current C occurs during the IDLE interval (IM+IS>IB). This causes the bias electric current source 65 to attempt to output an electric current having an amplitude not smaller than the predetermined amplitude IB[A]. This causes a drop in voltage at the output terminal OUT. This ultimately can cause an obstacle to operations of the modulation driver 63 and the auxiliary driver 64. In contrast, in a case where the compensating electric current source 66 is provided, the compensating electric current D compensates for the insufficiency during the IDLE interval (IM+IS=IB+α). Accordingly, an electric current will never be externally supplied to the transmitting circuit 6 through the output terminal OUT. This will never cause any obstacle to operations of the modulation driver 63 and the auxiliary driver 64 due to a drop in voltage caused at the output terminal OUT.

The compensating electric current source 66 can be realized by, for example, a diode (diode clamp) whose anode terminal is connected to a clamp power source (voltage Vcramp) and whose cathode terminal is connected to an output terminal OUT (see FIG. 2). Another example configuration of the compensating electric current source will be later discussed with reference to different drawings.

With the above configuration, it is possible to (i) promptly turn off the LD 7 at a starting point of an IDLE interval of a data signal supplied to the connector 2 and (ii) promptly turn on the LD 7 at an end point of the IDLE interval of the data signal supplied to the connector 2. Particularly, a delay time from the starting point/end point of the IDLE interval to turning off/on of the LD 7 becomes shorter as compared with a case where the LD 7 is turned off/on by cutting off/releasing cut-off of a bias electric current.

Figure 7:
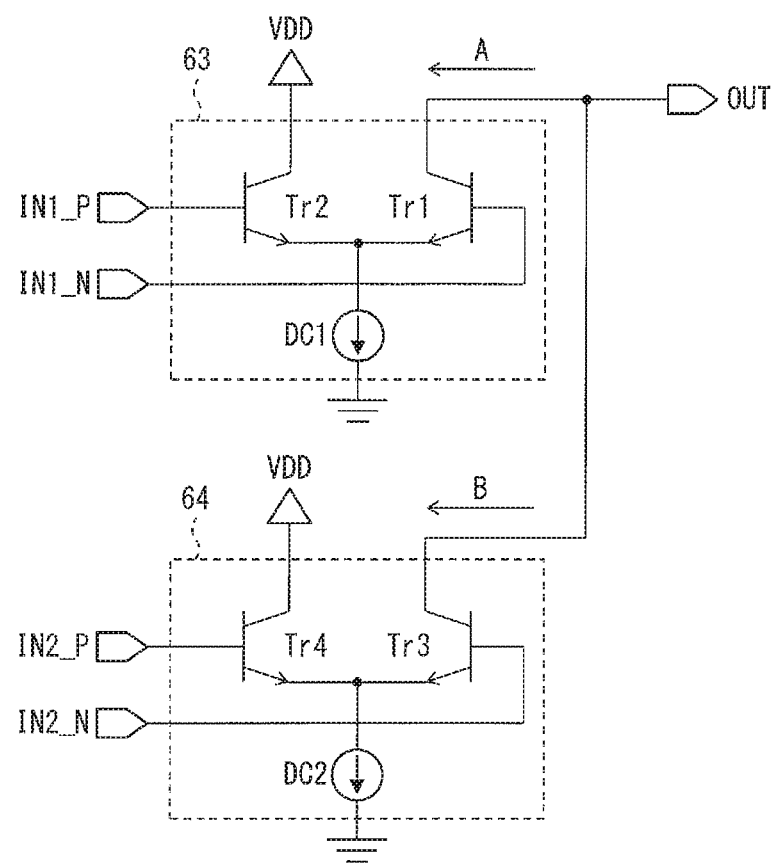
FIG. 7 is a circuit diagram illustrating a first example configuration of a modulation driver and an auxiliary driver each included in the transmitting circuit illustrated in FIG. 2.
Figure 8:
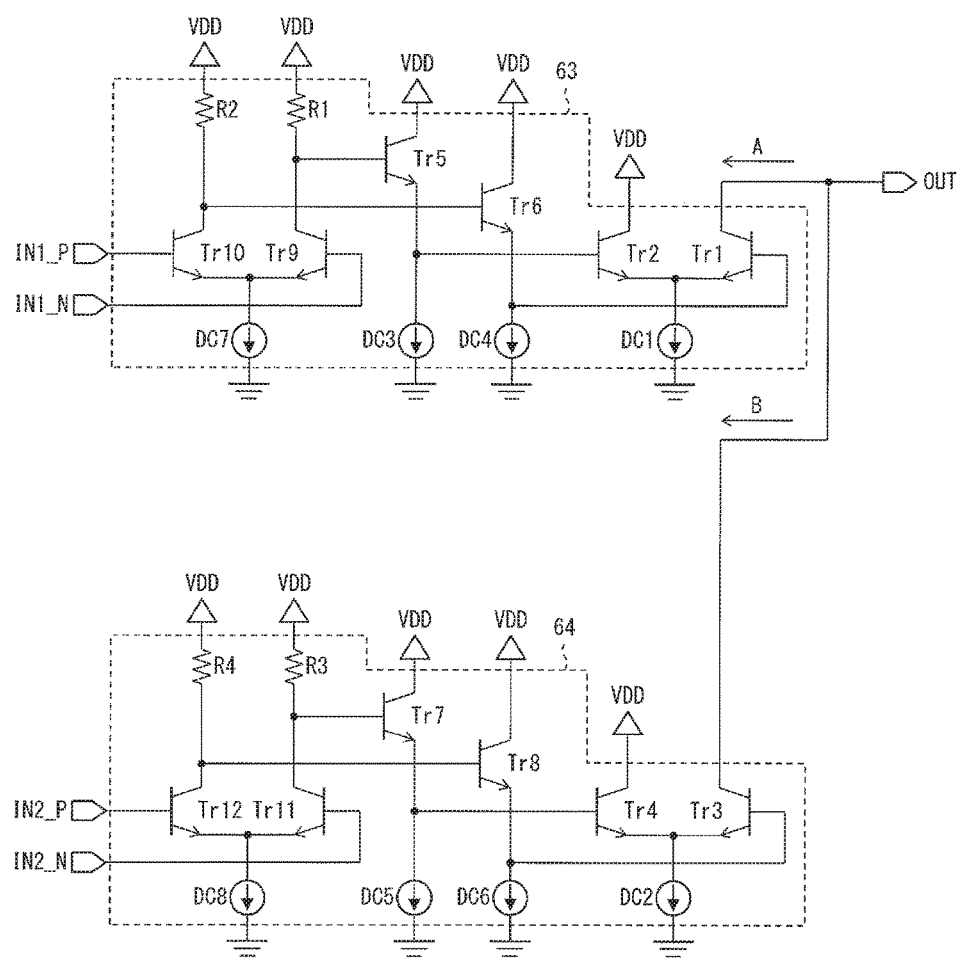
FIG. 8 is a circuit diagram illustrating a second example configuration of the modulation driver and the auxiliary driver each included in the transmitting circuit illustrated in FIG. 2.
Figure 9:
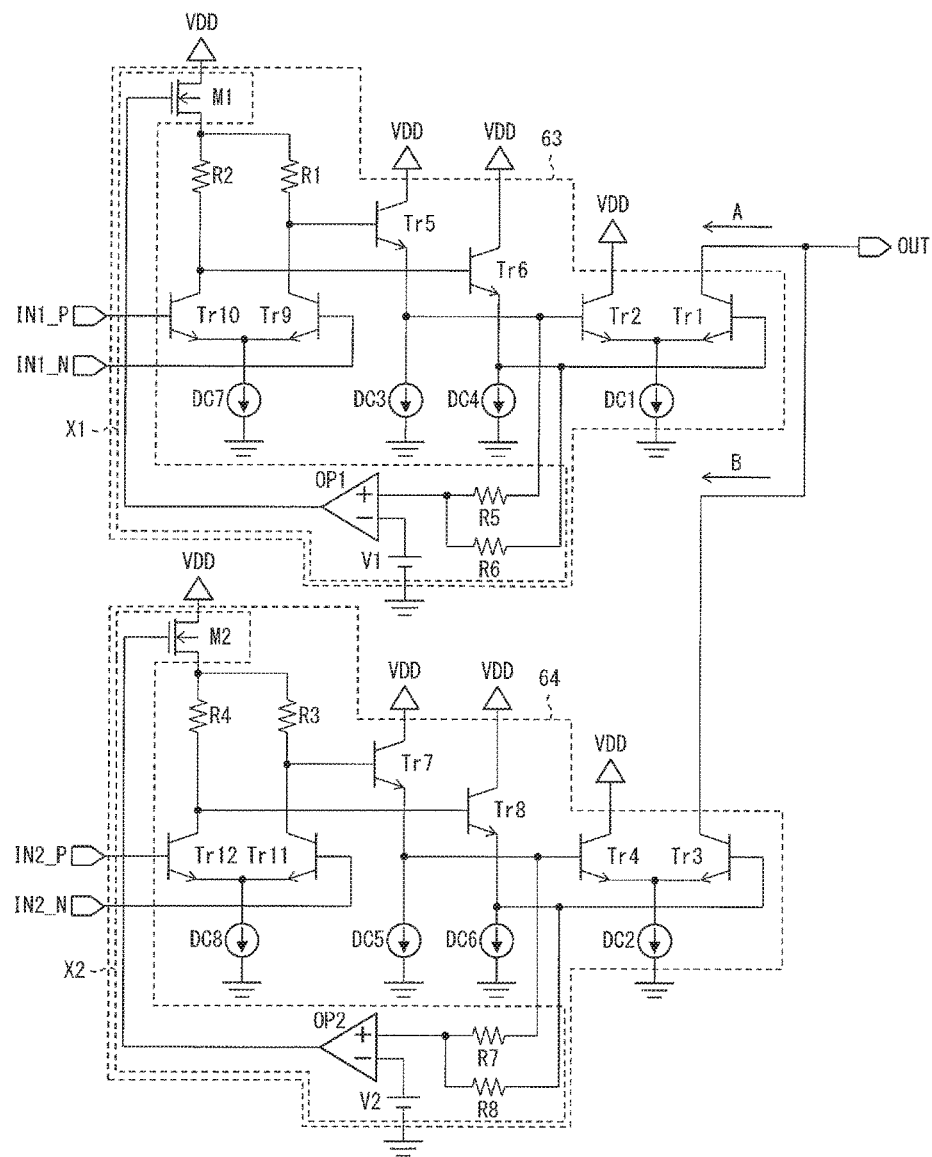
FIG. 9 is a circuit diagram illustrating a third example configuration of the modulation driver and the auxiliary driver each included in the transmitting circuit illustrated in FIG. 2.

The active optical cable 1 in accordance with the present embodiment makes it possible to control the driving electric current E, which flows in the LD 7 during the IDLE interval, to be 0[A] (see (f) of FIG. 4). That is, it is possible to keep the LD 7 turned off during the IDLE interval. Furthermore, according to the active optical cable 1 in accordance with the present embodiment, the auxiliary driver 64 realizes that the driving electric current E, which flows in the LD 7 during the IDLE interval, is controlled to be 0[A]. This makes it possible to cause a delay time from the starting point/end point of the IDLE interval to turning off/on of the LD 7 to be shorter as compared with a case where the LD 7 is turned off/on by cutting off/releasing cut-off of a power supply to each of the modulation driver 63 and the bias electric current source 65. In a case where, for example, the auxiliary driver 64 is configured as illustrated in FIGS. 7 through 9, a delay time from the starting point/end point of the IDLE interval to turning off/on of the LD 7 is not longer than 5 n seconds. Such a delay time is not longer than ⅙ times a delay time (not shorter than 30 n seconds) of a case where the LD 7 is turned off/on by cutting off/releasing cut-off of a power supply to each of the modulation driver 63 and the bias electric current source 65.

Note that the present embodiment has discussed an example configuration in which the driving electric current E, which flows out from the LD 7 during the IDLE interval, is controlled to be 0[A]. However, the present invention is not limited as such. An electric current which flows out from the LD 7 during the IDLE interval is not necessarily controlled to be 0[A], provided that the electric current is controlled to be not greater than a threshold electric current (oscillation inception current) of the LD 7. Such a configuration also makes it possible to keep the LD 7 turned off during the IDLE interval ("turn-off" includes an aspect in which the LD 7 is caused to weakly emit light).

Note that, in the present embodiment, the auxiliary electric current B is set to have the amplitude IS which satisfies IM+IS>IB. However, the present invention is not limited as such. Alternatively, the auxiliary electric current B can be set to have an amplitude IS which satisfies, for example, IM+IS=IB. In such a case, (i) the driving electric current E, which is to be supplied to the LD 7 during the IDLE interval, is also 0[A] and (ii) no insufficiency of the bias electric current C occurs during the IDLE interval. It follows that the compensating electric current source 66 can be omitted.

Patent Literature 4 discloses a semiconductor laser control device which (i) adds an electric current signal ΔIa, outputted from an electric current driving section, to an electric current signal ΔIb outputted from a compensator, (ii) adds a sum signal ΔI2=ΔIa+ΔIb thus obtained to an electric current signal ΔI1 outputted from an error amplifier, and (iii) supplies a sum signal ΔI1+ΔI2 thus obtained to an LD through an electric current amplifier. However, the electric current signal ΔIb, outputted from the compensator, is a differential electric current signal for compensating a rising/falling round edge of the electric current signal ΔIa, which is outputted from the electric current driving section, and is therefore not a signal for controlling the sum signal ΔIa+ΔIb to be 0 over a specific interval (e.g., an IDLE interval). Moreover, the electric current signal ΔI1, outputted from the error amplifier, is an electric current signal indicative of a difference between a monitor signal Im and a light emitting instruction signal Isig, and is therefore not a signal for controlling the sum signal ΔI1+ΔI2 to be 0 over a specific interval. As such, the semiconductor laser control device, disclosed in Patent Literature 4, does not include a configuration corresponding to the auxiliary driver 64 included in the transmitting circuit 6 in accordance with the present embodiment (i.e., a configuration for controlling the driving electric current E to be 0 over the IDLE interval by drawing in the auxiliary electric current B from the bias electric current source 65).

Note that the IDLE detection circuit 61 can also be realized by, for example, a peak hold circuit as with, for example, a signal detection circuit disclosed in Patent Literature 5. In doing so, for example, a reference voltage of a comparator disclosed in Patent Literature 5 can be a voltage which is (i) greater than an intermediate level of a data signal and (ii) smaller than a high level of the data signal. Note, however, that time constant of the peak hold circuit, during an electric discharge, needs to be long enough so that a bit pattern, in which identical values are successive, during the DATA interval will not be erroneously detected as an IDLE interval. This causes a reduction in response speed of the IDLE detection circuit 61, and ultimately makes it difficult to achieve a response speed required by a standard such as SAS 2.0 or PCIe 3.0.

[Example Configuration of IDLE Detection Circuit]

Figure 6:
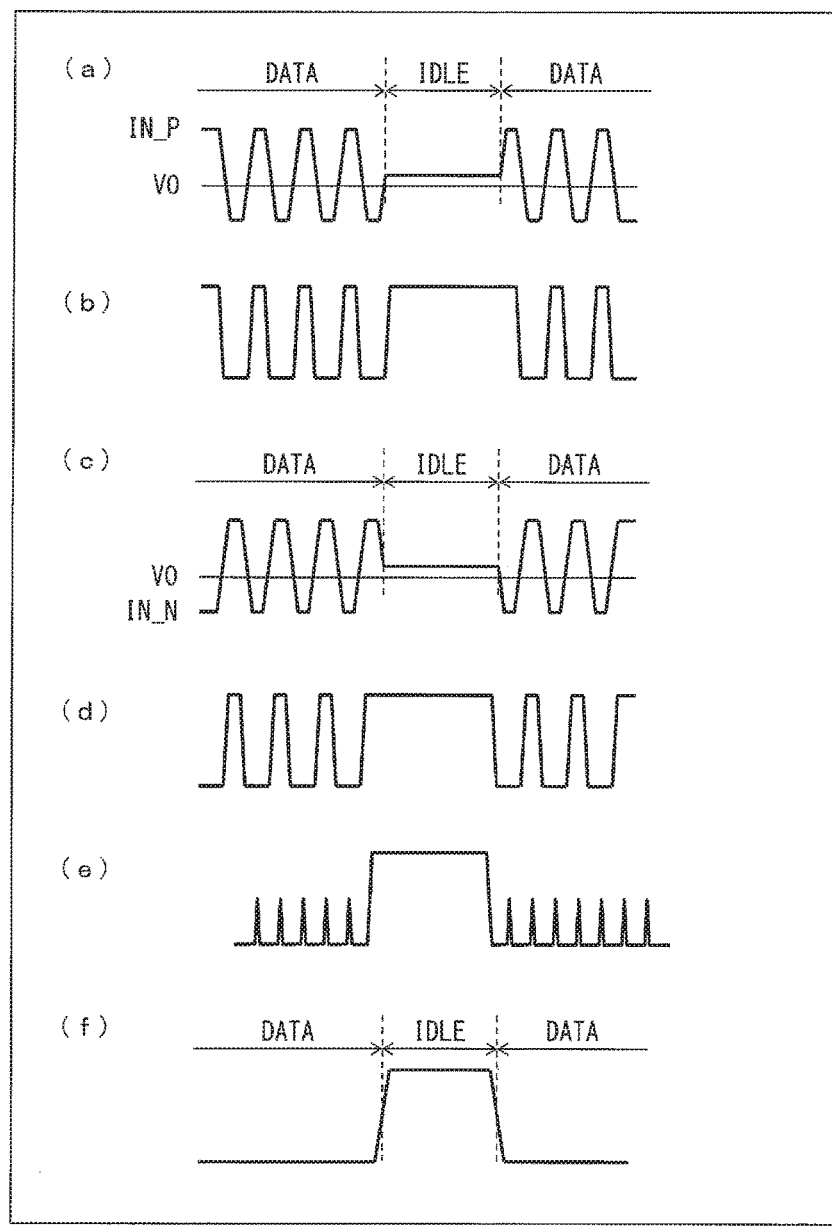
FIG. 6 is a waveform chart of a voltage signal in each section of the IDLE detection circuit illustrated in FIG. 5.

The following description will discuss, with reference to FIGS. 5 and 6, an example configuration of the IDLE detection circuit 61 discussed above. FIG. 5 is a circuit diagram illustrating an example configuration of the IDLE detection circuit 61. FIG. 6 is a waveform chart of a voltage signal in each section of the IDLE detection circuit 61 illustrated in FIG. 5.

As discussed above, the IDLE detection circuit 61 has a function of detecting an interval during which a data signal falls within a predetermined range that is between a high level and a low level. The IDLE detection circuit 61 illustrated in FIG. 5 includes a first comparator Comp1, a second comparator Comp2, an AND gate AND1, and a low-pass filter LPF1 so as to realize such a function.

A positive phase data signal is supplied to a noninverting input terminal of the first comparator Comp1 and a reference voltage V is supplied to an inverting input terminal of the first comparator Comp1. The first comparator Comp1 compares the positive phase data signal with the reference voltage V0 and creates a voltage signal indicative of a comparison result. Note that the reference voltage V0 is set to be a lower limit value of the above predetermined range. The positive phase data signal has a waveform as shown in (a) of FIG. 6. The voltage signal, created by the first comparator Comp1, has a waveform as shown in (b) of FIG. 6. The voltage signal created by the first comparator Comp1 is supplied to the AND gate AND1.

A negative phase data signal is supplied to a noninverting input terminal of the second comparator Comp2, and the reference voltage V0 is supplied to an inverting input terminal of the second comparator Comp2. The second comparator Comp2 compares a negative phase data signal with the reference voltage V0, and then creates a voltage signal indicative of a comparison result. The negative phase data signal has a waveform as shown in (c) of FIG. 6. The voltage signal, created by the second comparator Comp2, has a waveform as shown in (d) of FIG. 6. The voltage signal created by the second comparator Comp2 is supplied to the AND gate AND1.

The AND gate AND1 creates a voltage signal indicative of a logical multiplication of (i) the comparison result of the first comparator Comp1 and (ii) the comparison result of the second comparator Comp2. The voltage signal, created by the AND gate AND1, has a waveform as shown in (e) of FIG. 6. The voltage signal, created by the AND gate AND1, is supplied to the low-pass filter LPF1.

The low-pass filter LPF1 smoothens the voltage signal created by the AND gate AND1. That is, the low-pass filter LPF1 removes a noise which (i) is contained in a voltage signal created by the AND gate AND1 and (ii) is caused during switching logical values. The voltage signal, thus smoothened by the low-pass filter LPF1, has a waveform as shown in (f) of FIG. 6. That is, the voltage signal, smoothened by the low-pass filter LPF1, becomes a voltage signal which is at a high level during the IDLE interval (an interval other than the DATA interval) and which is at a low level during an interval other than the IDLE interval. The voltage signal smoothened by the low-pass filter LPF1 is outputted, as an IDLE detection signal, outside (for example, outputted to the squelch circuit 62 and the auxiliary driver 64).

Note that the squelch circuit 62 and the auxiliary driver 64 can be configured to operate with reference to (i) an IDLE detection signal which is at a high level during the IDLE interval or (ii) an IDLE detection signal which is at a high level during an interval other than the IDLE interval. In a case where the squelch circuit 62 and the auxiliary driver 64 are configured to operate with reference to the latter IDLE detection signal, it is possible to employ, for example, the following configuration. That is, it is possible to employ a configuration in which an IDLE detection signal outputted from the IDLE detection circuit 61 is supplied, via an inverting amplifier, to each of the squelch circuit 62 and the auxiliary driver 64.

Employment of the above configuration makes it possible to realize the IDLE detection circuit 61 which can (i) correctly identify an IDLE interval of a data signal supplied to the connector 2 and (ii) create, at a high speed, an IDLE detection signal which has edges at a starting point and an end point of the IDLE interval thus identified.

Note that the present embodiment employs a configuration in which the AND gate AND1 is followed by the low-pass filter LPF1. A configuration of the IDLE detection circuit 61, however, is not limited as such. That is, the AND gate AND1 can be omitted (see a first variation discussed later) in a case where (i) the AND gate AND1 operates at a low frequency and thus (ii) the voltage signal, created by the AND gate AND1, does not contain any spike noise which is caused during switching logical values. Note also that the present embodiment employs a configuration in which each of the positive phase data signal and the negative phase data signal is compared with a single reference voltage V0. A configuration of the IDLE detection circuit 61, however, is not limited as such. That is, in a case where two reference voltage sources are permissible, the IDLE detection circuit 61 can be configured such that the positive phase data signal and the negative phase data signal are compared with two reference voltages V0$a$ and V0$b$, respectively (see a second variation and a third variation discussed later). Such variations will be later discussed with reference to different drawings.

[Example Configuration of Modulation Driver and Auxiliary Driver]

The following description will discuss, with reference to FIG. 7 through FIG. 9, an example configuration of the modulation driver 63 and the auxiliary driver 64 each discussed above.

FIG. 7 is a circuit diagram illustrating a first example configuration of the modulation driver 63 and the auxiliary driver 64.

As illustrated in FIG. 7, the modulation driver 63 can be realized by, for example, a pair of transistors Tr1 and Tr2 (npn transistors) and a direct current source DC1. The transistor Tr1 has (i) a collector terminal connected to an output point OUT, (ii) a base terminal connected to an input point IN1_N, and (iii) an emitter terminal connected to an emitter terminal of the transistor Tr2. Meanwhile, the transistor Tr2 has (i) a collector terminal connected to a power source (power source voltage VDD), (ii) a base terminal connected to an input point IN1_P, and (iii) the emitter terminal connected to the emitter terminal of the transistor Tr1. An intermediate point between the emitter terminal of the transistor Tr1 and the emitter terminal of the transistor Tr2 is grounded via the direct current source DC1. An electric current outputted by the direct current source DC1 is externally settable.

A positive phase data signal is supplied, via the input point IN1_P, to the modulation driver 63 and a negative phase data signal is supplied, via the input point IN1_N, to the modulation driver 63. In a case where the data signal is at a low level, the modulation driver 63 draws in, from the output point OUT, a modulation electric current A having a predetermined amplitude (IM[A]). In a case where the data signal is at a high level, the modulation driver 63 halts drawing in the modulation electric current A from the output point OUT.

As illustrated in FIG. 7, the auxiliary driver 64 can be realized by, for example, a pair of transistors Tr3 and Tr4 (npn transistors) and a direct current source DC2. The auxiliary driver 64 is identical to the modulation driver 63 in configuration, and description of the auxiliary driver 64 is therefore omitted.

A negative phase IDLE detection signal is supplied, via an input point IN2_P, to the auxiliary driver 64 and a positive phase IDLE detection signal is supplied, via an input point IN2_N, to the auxiliary driver 64. In a case where the IDLE detection signal is at a high level, the auxiliary driver 64 draws in, from an output point OUT, an auxiliary electric current B having a predetermined amplitude (IS[A]). In a case where the IDLE detection signal is at a low level, the auxiliary driver 64 halts drawing in the auxiliary electric current B from the output point OUT.

Note that the above example configuration employs an npn transistor as each of the transistor Tr1 through Tr4 which constitute the modulation driver 63 and the auxiliary driver 64. However, the present invention is not limited as such. Alternatively, the present embodiment can employ an NMOS transistor as each of the transistor Tr1 through Tr4 which constitute the modulation driver 63 and the auxiliary driver 64.

FIG. 8 is a circuit diagram illustrating a second example configuration of the modulation driver 63 and the auxiliary driver 64.

According to a modulation driver 63 illustrated in FIG. 8, a pre-driver, which amplifies a data signal, is provided so as to be followed by a main driver, i.e., the modulation driver 63 illustrated in FIG. 7. The main driver converts, into an electric current signal, a data signal amplified by the pre-driver.

A differential amplifier circuit is a circuit for carrying out differential amplification with respect to a data signal. The differential amplifier circuit is composed of a pair of resistors R1 and R2, a pair of transistors (npn transistors) Tr9 and Tr10, and a direct current source DC7. The transistor Tr9 has (i) a collector terminal connected to a power source (voltage VDD) via the resistor R1, (ii) a base terminal connected to an input point IN1_N, and (iii) an emitter terminal connected to an emitter terminal of the transistor Tr10. The transistor Tr10 has (i) a collector terminal connected to a power source (voltage VDD) via the resistor R2, (ii) a base terminal connected to an input point IN1_P, and (iii) the emitter terminal connected to the emitter terminal of the transistor Tr9. An intermediate point between the emitter terminal of the transistor Tr9 and the emitter terminal of the transistor Tr10 is grounded via the direct current source DC7.

An emitter follower circuit is a circuit for causing an output impedance of the pre-driver to be lower than an input impedance of the main driver. The emitter follower circuit is composed of a pair of transistors Tr5 and Tr6 (npn transistors) and a pair of direct current sources DC3 and DC4. The transistor Tr5 has (i) a collector terminal connected to a power source (voltage VDD), (ii) a base terminal connected to one output point (the collector terminal of the transistor Tr9) of the differential amplifier circuit, and (iii) an emitter terminal grounded via the direct current source DC3. An emitter voltage of the transistor Tr5 is supplied, as a positive phase data signal, to the base terminal of the transistor Tr2 which constitutes the main driver. The transistor Tr6 has (i) a collector terminal connected to a power source (voltage VDD), (ii) a base terminal connected to the other output point (the collector terminal of the transistor Tr10) of the differential amplifier circuit, and (iii) an emitter terminal grounded via the direct current source DC4. An emitter voltage of the transistor Tr6 is supplied, as a negative phase data signal, to the base terminal of the transistor Tr1 which constitutes the main driver.

According to the auxiliary driver 64 illustrated in FIG. 8, a pre-driver, which amplifies an IDLE detection signal, is provided so as to be followed by a main driver, i.e., the auxiliary driver 64 illustrated in FIG. 7. The main driver converts, into an electric current signal, an IDLE detection signal amplified by the pre-driver. The pre-driver which constitutes the auxiliary driver 64 is identical in configuration to the pre-driver which constitutes the modulation driver 63 and as such, descriptions of the pre-driver are omitted.

Note that the above example configuration employs an npn transistor as each of the transistor Tr1 through Tr12 which constitute the modulation driver 63 and the auxiliary driver 64. The present invention is not, however, limited as such. Alternatively, an NMOS transistor can be employed as each of the Tr1 through Tr12 which constitute the modulation driver 63 and the auxiliary driver 64.

FIG. 9 is a circuit diagram illustrating a third example configuration of the modulation driver 63 and the auxiliary driver 64.

A modulation driver 63 illustrated in FIG. 9 includes the modulation driver 63 illustrated in FIG. 8 and a stabilizing circuit X1 for stabilizing an output voltage of the pre-driver.

The stabilizing circuit X1 includes a transistor M1 (PMOS transistor) and a voltage drop amount controlling circuit. The voltage drop amount controlling circuit controls, in accordance with an output voltage of the pre-driver, an amount of a drop in voltage caused at the transistor M1.

The transistor M1 has (i) a source terminal connected to a power source (voltage VDD) and (ii) a drain terminal connected to the collector terminals of the respective transistors Tr9 and Tr10, via the respective resistors R1 and R2, which constitute the differential amplifier circuit of the pre-driver. The transistor M1 serves as a voltage dropping device which can vary an amount of a drop in voltage.

The voltage drop amount control circuit is composed of (i) a pair of resistors R5 and R6 which have identical resistances and (ii) an operational amplifier OP1. The resistors R5 and R6 are connected in series so as to be provided between the emitter terminals of the respective transistors Tr5 and Tr6 which constitute the emitter follower circuit of the pre-driver. Note that a voltage, at an intermediate point between the resistors R5 and R6, coincides with an average voltage (hereinafter referred to as the "average emitter voltage") between emitter voltages in the respective transistors Tr5 and Tr6. A noninverting input terminal of the operational amplifier OP1 is connected to the intermediate point between the resistors R5 and R6. The average emitter voltage across the transistors Tr5 and Tr6 is supplied to the noninverting input terminal of the operational amplifier OP1.

Meanwhile, a predetermined reference voltage V1 is supplied to an inverting input terminal of the operational amplifier OP1. An output terminal of the operational amplifier OP1 is connected to a gate terminal of the transistor M1.

In a case where an output voltage of the pre-driver, i.e., the average emitter voltage across the transistors Tr5 and Tr6 exceeds the reference voltage V1, the stabilizing circuit X1 operates as follows. That is, in such a case, an output voltage of the operational amplifier OP1 increases, and consequently a gate voltage of the transistor M1 increases. This causes an increase in resistance between the source terminal and the drain terminal of the transistor M1, and consequently causes an increase in amount of a drop in voltage caused at the transistor M1. As this ultimately causes a reduction in voltage to be applied to the pre-driver, an output voltage of the pre-driver is reduced. The above operation continues until the average emitter voltage across the transistors Tr5 and Tr6 coincides with the reference voltage V1.

In contrast, in a case where the output voltage of the pre-driver, i.e., the average emitter voltage across the transistors Tr5 and Tr6, is smaller than the reference voltage V1, the stabilizing circuit X1 operates as follows. That is, in such a case, the output voltage of the operational amplifier OP1 drops, and consequently the gate voltage of the transistor M1 drops. This causes a reduction in resistance between the source terminal and the drain terminal of the transistor M1, and consequently causes a reduction in amount of a drop in voltage caused at the transistor M1. As this ultimately causes an increase in voltage to be applied to the pre-driver, the output voltage of the pre-driver increases. The above operation continues until the average emitter voltage across the transistors Tr5 and Tr6 coincides with the reference voltage V1.

In a case where the output voltage of the pre-driver fluctuates in response to a fluctuation in power source voltage of the pre-driver, it is necessary to impose strict conditions on a fluctuation range of the power source voltage of the pre-driver. This prevents an operating condition of each constituent of the main driver from being not met. That is, by further providing the stabilizing circuit X1, the output voltage of the pre-driver does not fluctuates in response to the fluctuation in power source voltage of the pre-driver. This eliminates the need for imposing strict conditions on the fluctuation range of the power source voltage of the pre-driver.

An auxiliary driver 64 illustrated in FIG. 9 includes the auxiliary driver 64 illustrated in FIG. 8 and a pre-driver stabilizing circuit X2 for stabilizing an output voltage of the pre-driver. The stabilizing circuit X2 which constitutes the auxiliary driver 64 is identical in configuration to the stabilizing circuit X1 which constitutes the modulation driver 63 and as such, descriptions of the pre-driver stabilizing circuit X2 are omitted.

Note that the above example configuration employs a PMOS transistor as each of the transistors M1 and M2 which constitute the stabilizing circuits X1 and X2, respectively.

However, the present invention is not limited as such. Alternatively, a pnp transistor can be employed as each of the transistors which constitute the respective stabilizing circuits X1 and X2.

[Example Configuration of Bias Electric Current Source]

Figure 10:
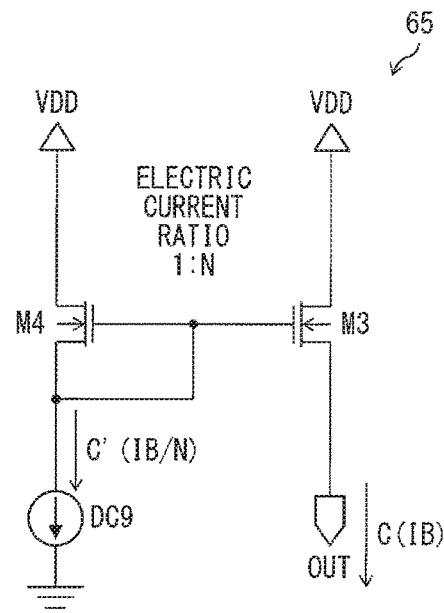
FIG. 10 is a circuit diagram illustrating a first example configuration of a bias electric current source included in the transmitting circuit illustrated in FIG. 2.
Figure 11:
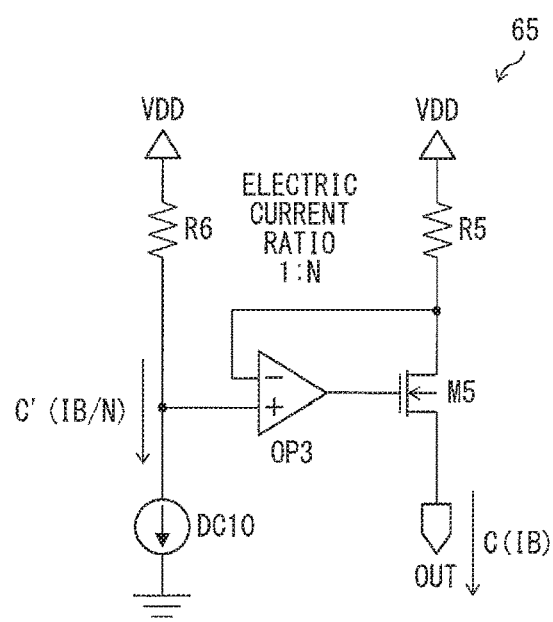
FIG. 11 is a circuit diagram illustrating a second example configuration of the bias electric current source included in the transmitting circuit illustrated in FIG. 2.

The following description will discuss, with reference to FIGS. 10 and 11, an example configuration of the bias electric current source 65 as has been discussed.

FIG. 10 is a circuit diagram illustrating a first example configuration of the bias electric current source 65.

The bias electric current source 65 can be realized by, for example, a pair of transistors M3 and M4 (PMOS transistors) and a direct current source DC9 (see FIG. 10).

The transistor M3 has a source terminal connected to a power source (voltage VDD). The transistor M4 has (i) a source terminal connected to a power source (voltage VDD) and (ii) a drain terminal and a gate terminal which are connected to each other. The drain terminal of the transistor M4 is connected to a gate terminal of the transistor M3. That is, the transistors M3 and M4 constitute a current mirror circuit in which (i) the drain terminal of the transistor M4 serves as an input point and (ii) a drain terminal of the transistor M3 serves as an output point.

Sizes of the respective transistors M3 and M4 are set so that an electric current C which flows out from the output point of the current mirror circuit becomes N-times that of an electric current C' which flows out from the input point of the current mirror circuit. As such, by connecting the direct current source DC9, which flows the electric current C' having an amplitude IB/N[A], to the input point of the current mirror circuit, it is possible to take out, from the output point of the current mirror circuit, the electric current C having an amplitude IB[A].

Note that the above example configuration employs a PMOS transistor as each of the transistors M3 and M4 which constitute the bias electric current source 65. However, the present invention is not limited as such. Alternatively, a pnp transistor can be employed as each of the transistors M3 and M4 which constitute the bias electric current source 65, provided that the transistors M3 and M4 are identical in type. That is, in a case where a PMOS transistor is employed as the transistor M3, a PMOS transistor is employed as the transistor M4. Similarly, in a case where a pnp transistor is employed as the transistor M3, a pnp transistor is employed as the transistor M4.

FIG. 11 is a circuit diagram illustrating a second example configuration of the bias electric current source 65.

As illustrated in FIG. 11, the bias electric current source 65 can be realized by, for example, an operational amplifier OP3, a transistor M5 (PMOS transistor), a pair of resistors R5 and R6, and a direct current source DC10.

The operational amplifier OP3 has (i) a noninverting input terminal connected to a power source (voltage VDD) via the resistor R6 and (ii) an inverting input terminal connected to (a) a power source (voltage VDD) via the resistor R5 and (b) a source terminal of the transistor M5. An output terminal of the operational amplifier OP3 is connected to a gate terminal of the transistor M5. That is, the operational amplifier OP3, the transistor M5, and the resistors R5 and R6 constitute a current mirror circuit in which (i) the noninverting input terminal of the operational amplifier OP3 serves as an input point and (ii) a drain terminal of the transistor M5 serves as an output point.

Resistances of the respective resistors R5 and R6 are set so that an electric current C, which flows out from the output point of the current mirror circuit, becomes N-times that of an electric current C' which flows out from the input point of the current mirror circuit. That is, the resistances of the respective resistors R5 and R6 are set so that R5:R6=1:N. As such, by connecting the direct current source DC10, which flows the electric current C' having an amplitude IB/N[A], to the input point of the current mirror circuit, it is possible to take out, from the output point of the current mirror circuit, an electric current C having an amplitude IB[A].

Note that the above example configuration employs a PMOS transistor as the transistor M5 which constitutes the bias electric current source 65. However, the present invention is not limited as such. Alternatively, a pnp transistor can be employed as the transistor M5 which constitutes the bias electric current source 65.

The transmitting circuit 6 can be realized by (i) a single bias electric current source 65 which is configured as illustrated in FIG. 10 or (ii) a single bias electric current source 65 configured as illustrated in FIG. 11. Alternatively, the transmitting circuit 6 can be configured to include both of (i) the bias electric current source 65 configured as illustrated in FIG. 10 and (ii) the bias electric current source 65 configured as illustrated in FIG. 11 so that they can be switched from one to the other or vice versa. The bias electric current source 65, configured as illustrated in FIG. 10, is suitable for transmitting an intermittent signal such as an OOB signal defined by SAS 2.0. This is because such a bias electric current source 65 (i) is hard to fluctuate in response to a rapid fluctuation in bias voltage of the LD 7 and (ii) promptly responds to a transition from an IDLE interval to a DATA interval, although the bias electric current source 65, configured as illustrated in FIG. 10, has a tendency that an electric current ratio is easy to fluctuate in response to a fluctuation of the power source (voltage VDD). In contrast, the bias electric current source 65, configured as illustrated in FIG. 11, is suitable for transmitting a continuous signal defined by, for example, the Infini-Band standard. This is because such a bias electric current source 65 is easy to fluctuate in response to an rapid fluctuation in bias voltage of the LD 7, and therefore slowly responds to a transition from an IDLE interval to a DATA interval, although the bias electric current source 65, configured as illustrated in FIG. 11, has an electric current ratio which is hard to fluctuate in response to a fluctuation of the power source (voltage VDD). As such, by employing a configuration in which switching is carried out to one of the two bias electric current sources 65 which one is to be used and to be suitable for a type of a data signal to be transmitted, it is possible to realize a transmitting circuit 6 which is suitable for both of transmission of an intermittent signal and transmission of a continuous signal.

[Example Configuration of Compensating Electric Current Source]

Figure 12:
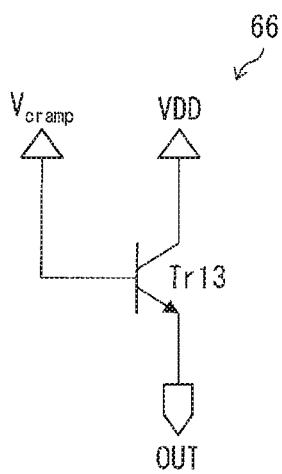
FIG. 12 is circuit diagram illustrating a first example configuration of a compensating electric current source included in the transmitting circuit illustrated in FIG. 2.
Figure 13:
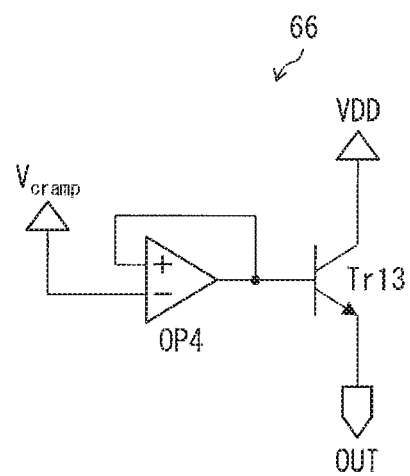
FIG. 13 is a circuit diagram illustrating a second example configuration of the compensating electric current source included in the transmitting circuit illustrated in FIG. 2.

The following description will discuss, with reference to FIGS. 12 and 13, an example configuration of the compensating electric current source 66 discussed above.

FIG. 12 is a circuit diagram illustrating a first example configuration of the compensating electric current source 66.

As illustrated in FIG. 12, the compensating electric current source 66 can be realized by a transistor Tr13 (npn transistor).

The transistor Tr13 has (i) a collector terminal connected to a power source (voltage VDD) and (ii) a base terminal connected to a clamp power source (voltage Vcramp).

The compensating electric current source 66 outputs a compensating electric current D in a case where an emitter voltage of the transistor Tr13 falls below a threshold voltage Vth. The threshold voltage Vth is expressed by Vth=Vcramp−VBE, where VBE is a voltage across the base terminal and an emitter terminal of the transistor Tr13.

Note that the above example configuration employs a Pnpn transistor as the transistor Tr13 which constitutes the compensating electric current source 66. However, the present invention is not limited as such. Alternatively, a NMOS transistor can be employed as the transistor Tr13 which constitutes the compensating electric current source 66.

FIG. 13 is a circuit diagram illustrating a second example configuration of the compensating electric current source 66.

The compensating electric current source 66 (see FIG. 13) includes the compensating electric current source 66 illustrated in FIG. 12 and an operational amplifier OP4.

The operational amplifier OP4 has a noninverting input terminal and an output terminal which are directly connected to each other so as to constitute a voltage follower circuit. The operational amplifier OP4 has (i) an inverting input terminal connected to the clamp power source (voltage Vcramp) and (ii) the output terminal connected to the base terminal of the transistor Tr13.

The compensating electric current source 66 illustrated in FIG. 13 also outputs a compensating electric current D in a case where an emitter voltage of the transistor Tr13 falls below a threshold voltage Vth. The threshold voltage Vth is expressed by Vth=Vcramp−VBE, where VBE is a voltage across the base terminal and an emitter terminal of the transistor Tr13.

[Variation of Transmitting Circuit and LD]

According to the active optical cable 1 in accordance with the above embodiment, the transmitting circuit 6 and the LD 7 (see FIG. 2) can be replaced by a transmitting circuit 16 and an LD 17 (see FIG. 14), respectively.

Note that the LD 7 illustrated in FIG. 2 is an LD, such as a vertical cavity emitting laser (VCSEL), which can control its light emitting amount by changing a driving electric current which flows in the LD7. The transmitting circuit 6 (see FIG. 2) is suitable for such an LD. However, the transmitting circuit 6 (see FIG. 2) can employ, as a light source, any light emitting element (i.e., not limited to an LD) which can control its light emitting amount by changing a driving electric current which flows in the LD7. In contrast, the LD 17 (see FIG. 14) is an LD, such as a distributed feedback laser diode (DFB-LD) or a Fabry Perot laser diode (FP-LD), which can control its light emitting amount by changing a driving electric current which is to flow out from the LD. The transmitting circuit 16 (see FIG. 14) is suitable for such an LD. However, the transmitting circuit 16 (see FIG. 14) can employ, as a light source, any light emitting element (i.e., not limited to an LD), which can control its light emitting amount by changing a driving electric current which is to flow out from the light emitting element.

Figure 14:
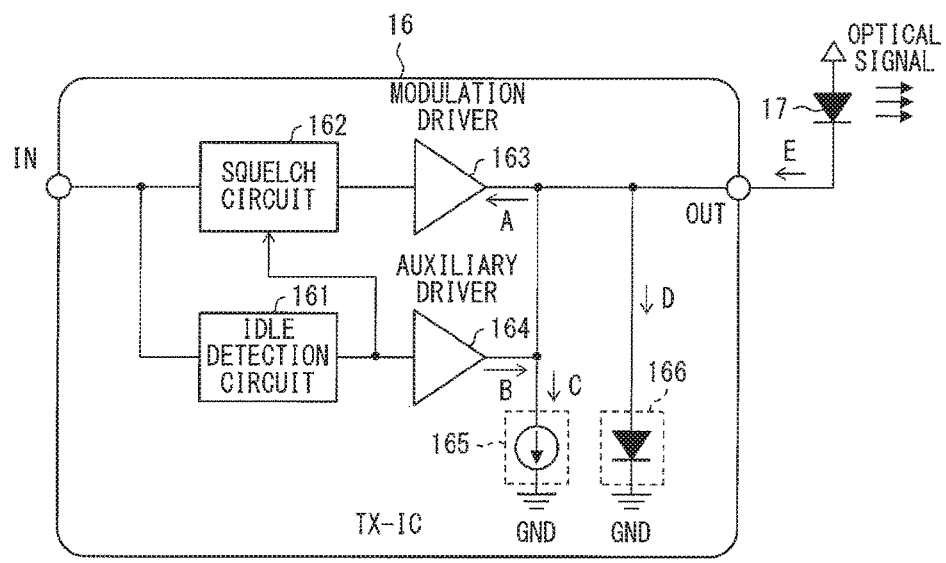
FIG. 14 is a block diagram illustrating a variation of the transmitting circuit illustrated in FIG. 2.
Figure 15:
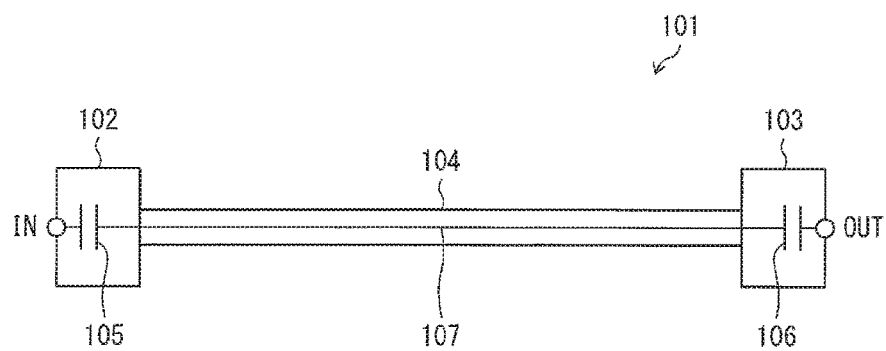
FIG. 15 is a block diagram illustrating a configuration of a metal cable according to a conventional technique.

The following description will discuss, with reference to FIG. 14, a configuration of the transmitting circuit 16 in accordance with the present variation. FIG. 14 is a block diagram illustrating the transmitting circuit 16 in accordance with the present variation.

As illustrated in FIG. 14, the transmitting circuit 16 in accordance with the present variation includes an IDLE detection circuit 161, a squelch circuit 162, a modulation driver 163, an auxiliary driver 164, a bias electric current source 165, and a compensating electric current source 166.

The IDLE detection circuit 161 and the squelch circuit 162 included in the transmitting circuit 16 in accordance with the present variation are respectively identical in function to the IDLE detection circuit 61 and the squelch circuit 62 in the transmitting circuit 6 (see FIG. 2), and their descriptions are therefore omitted. The following description will discuss a function of each of the modulation driver 163, the auxiliary driver 164, the bias electric current source 165, and the compensating electric current source 166 in the transmitting circuit 16 in accordance with the present variation.

The modulation driver 163 draws in a modulation electric current A in accordance with a corrected data signal obtained in the squelch circuit 162. More specifically, in a case where the corrected data signal is at a high level, the modulation driver 163 draws in the modulation electric current A having a predetermined amplitude (IM[A]). In a case where the corrected data signal is at a low level, the modulation driver 163 halts drawing in the modulation electric current A.

The auxiliary driver 164 identifies an IDLE interval with reference to an IDLE detection signal obtained in the IDLE detection circuit 161. The auxiliary driver 164 draws out, during the IDLE interval thus identified, an auxiliary electric current B having a predetermined amplitude (IS[A]). The auxiliary electric current B, which is drawn out by the auxiliary driver 164 during the IDLE interval, is set to have an amplitude IS which satisfies IS=IB+α where α is a positive constant number so that IS>IB is satisfied, where IB is a bias electric current C which is drawn in by the bias electric current source 165.

The bias electric current source 165 draws in the bias electric current C having a predetermined amplitude (IB [A]). The bias electric current source 165 can be realized by, for example, a direct current source whose one end is connected to an output terminal OUT and whose other end is grounded (see FIG. 14).

In a case where a difference, resulting from subtracting the modulation electric current A (which is 0[A] during the IDLE interval) from the auxiliary electric current B, exceeds the bias electric current C, the compensating electric current source 166 draws in a compensating electric current D which compensates for an insufficiency of the bias electric current C. The compensating electric current D, which is drawn in by the compensating electric current source 166 during the IDLE interval, satisfies IS−IB=α[A]. The compensating electric current source 166 can be realized by, for example, a diode (diode clamp) having (i) an anode terminal connected to the output terminal OUT and (ii) a cathode terminal which is grounded (see FIG. 14). As illustrated in FIG. 14, the compensating electric current source 166 draws in the compensating electric current D from the output terminal OUT, in a case where a voltage across the anode terminal and the cathode terminal of the diode exceeds a threshold voltage Vth, i.e., in a case where a voltage of the output terminal OUT exceeds the threshold voltage Vth.

In the transmitting circuit 16 in accordance with the present variation, the modulation driver 163, the auxiliary driver 164, the bias electric current source 165, the compensating electric current source 166, and the LD 17 are connected so that a driving electric current E =(C+D)+A−B, which results from (i) adding the modulation electric current A to a sum of the bias electric current C and the compensating electric current D (C+D) and (ii) subtracting the auxiliary electric current B from the addition (C+D)+A, flows from the LD 17.

The transmitting circuit 16 in accordance with the present variation makes it possible for the driving electric current E, which flows from the LD 17 during the IDLE interval, to become 0[A]. That is, it is possible to keep the LD 17 turned off during the IDLE interval. Furthermore, according to the transmitting circuit 16, the auxiliary driver 164 realizes that the driving electric current E, which flows from the LD 17 during the IDLE interval, is controlled to be 0[A]. This makes it possible to cause a delay time from a starting point/end point of the IDLE interval to turning off/on of the LD 17 to be shorter as compared with a case where the LD 17 is turned off/on by cutting off/releasing cut-off of a bias electric current.

The present variation employs a configuration in which the driving electric current E, which flows from the LD 17 during the IDLE interval, is controlled to be 0[A]. The present invention is, however, not limited as such. Alternatively, the present invention can employ a configuration in which the driving electric current E, which flows from the LD 17 during the IDLE interval, is controlled to be not greater than a threshold electric current (oscillation inception start current) of the LD 17. Such a configuration also makes it possible to keep the LD 17 turned off during the IDLE interval ("turn-off" includes an aspect in which the LD 7 is caused to weakly emit light).

The transmitting circuit 16 in accordance with the present variation makes it possible to securely keep the LD 17 turned off during the IDLE interval. This is because the auxiliary electric current B, which the auxiliary driver 164 draws out during the IDLE interval, is set to have the amplitude IS which satisfies IS>IB. Furthermore, even in a case where, during the IDLE interval, the amplitude IS of the auxiliary electric current B exceeds the amplitude of the bias electric current C, the transmitting circuit 16 in accordance with the present variation does not cause any obstacles to operations of the modulation driver 163 and the auxiliary driver 164 due to a drop in voltage caused at the output terminal OUT. This is because, in a case where the amplitude IS of the auxiliary electric current B exceeds the amplitude IB of the bias electric current C, the compensating electric current D, which is drawn out by the compensating electric current source 166, compensates for an insufficiency of the bias electric current C.

The present variation employs a configuration in which the auxiliary electric current B, which the auxiliary driver 164 draws in during the IDLE interval, is set to have the amplitude IS which satisfies IS>IB. However, the present invention is not limited as such. Alternatively, the present invention can employ a configuration in which the auxiliary electric current B, which the auxiliary driver 164 draws in during the IDLE interval, is set to have the amplitude IS which satisfies IS=IB. Such a configuration also makes it possible to control the driving electric current E, which flows from the LD 17 during the IDLE interval, to be 0[A]. In a case where the auxiliary electric current B is set to have the amplitude IS which satisfies IS=IB, no insufficiency of the bias electric current C occurs during the IDLE interval. It follows that the compensating electric current source 166 can be omitted.

[First Variation of IDLE Detection Circuit]

The following description will discuss, with reference to FIG. 17, a first variation of the IDLE detection circuit 61 (see FIG. 5). FIG. 17 is a circuit diagram illustrating a configuration of the IDLE detection circuit 61a in accordance with the first variation.

As illustrated in FIG. 17, the IDLE detection circuit 61a in accordance with the first variation includes, as with the IDLE detection circuit 61 (see FIG. 5), a first comparator Comp1, a second comparator Comp2, and an AND gate AND1. Note, however, that an operating frequency of the AND gate AND1 is set to be sufficiently low (e.g., not greater than 1/10 times operating frequencies of the respective comparators Comp1 and Comp2) to an extent that an voltage signal to be created does not contain any spike noise which is caused during switching logical values. This eliminates the needs for providing, in the IDLE detection circuit 61a, a low-pass filter LPF1 for removing such a spike noise which is caused during switching logical values.

By comparing, with a single reference voltage V0, each of a positive phase data signal and a negative phase data signal, each of the IDLE detection circuit 61 (see FIG. 5) and the IDLE detection circuit 61a (see FIG. 17) detect, as an IDLE interval, an interval during which a data signal falls within a range from a lower limit voltage V0 to an upper limit voltage 2×Vcom−V0, where Vcom is a common voltage of the data signal. The above method makes it possible to securely detect an IDLE interval, in a case where a difference is fully small between (i) an intermediate level of the data signal and (ii) the common voltage of the data signal. In compensation for the lower limit voltage of and the upper limit voltage of the predetermined range being not able to independently set in the above method, the above method can offer a common advantage that only a single reference voltage source needs to be provided. Particularly, it is to be noted that the IDLE detection circuit 61a illustrated in FIG. 17 does not need the low-pass filter LPF1. This causes the IDLE detection circuit 61a to offer a further advantage that its circuit configuration can be simplified as compared with the IDLE detection circuit 61 (see FIG. 5).

[Second Variation of IDLE Detection Circuit]

The following description will discuss, with reference to FIGS. 18 and 19, a second variation of the IDLE detection circuit 61 illustrated in FIG. 5. FIG. 18 is a circuit diagram illustrating a configuration of an IDLE detection circuit 61b in accordance with the second variation. FIG. 19 is a waveform chart of a voltage signal in each section of the IDLE detection circuit 61b in accordance with the second variation.

As illustrated in FIG. 18, the IDLE detection circuit 61b in accordance with the second variation includes, as with the IDLE detection circuit 61, a first comparator Comp1, a second comparator Comp2, an AND gate AND1, and a low-pass filter LPF1. Note, however, that the IDLE detection circuit 61b in accordance with the second variation differs from the IDLE detection circuit 61 in the following two points. Firstly, the IDLE detection circuit 61b is configured so that one and the same data signal (in the second variation, one and the same positive phase data signal) is supplied to each of a noninverting input terminal of the first comparator Comp1 and an inverting input terminal of the second comparator Comp2. Namely, a positive phase data signal having a waveform shown in (a) of FIG. 19 is supplied to each of the comparators Comp1 and Comp2. Secondly, the IDLE detection circuit 61b is configured so that a reference voltage V0a and a reference voltage V0b, which differ from each other, are supplied to an inverting input terminal of the first comparator Comp1 and a noninverting input terminal of the second comparator Comp2, respectively.

That is, a positive phase data signal is supplied to the noninverting input terminal of the first comparator Comp1 and the reference voltage V0a is supplied to the inverting input terminal of the first comparator Comp1. The first comparator Comp1 compares the positive phase data signal with the reference voltage V0a and creates a voltage signal indicative of a comparison result. The reference voltage V0a is set to be a smaller limit voltage in a predetermined range, which is between a high level and a low level, within which predetermined range the data signal falls. The positive phase data signal has a waveform as shown in (b) of FIG. 19. The voltage signal, created by the first comparator Comp1, has a waveform as shown in (c) of FIG. 19. The voltage signal is supplied from the first comparator Comp1 to the AND gate AND1.

According to the IDLE detection circuit 61b, (i) a positive phase data signal is supplied to the inverting input terminal of the second comparator Comp2 and (ii) the reference voltage V0b is supplied to the noninverting input terminal of the second comparator Comp2. The second comparator Comp2 compares the positive phase data signal with the reference voltage V0b, and then outputs a voltage signal indicative of a comparison result. Note that the reference voltage V0b is set to be an upper limit voltage in the above predetermined range. The positive phase data signal has a waveform as shown in (d) of FIG. 19. The voltage signal created by the second comparator Comp2 has a waveform as shown in (e) of FIG. 19. The voltage signal created by the second comparator Comp2 is supplied to the AND gate AND1.

The AND gate AND1 creates a voltage signal indicative of a logical multiplication of (i) the comparison result of the first comparator Comp1 and (ii) the comparison result of the second comparator Comp2. The voltage signal, created by the AND gate AND1, has a waveform as shown in (f) of FIG. 19. The voltage signal, created by the AND gate AND is supplied to the low-pass filter LPF1.

The low-pass filter LPF1 smoothens the voltage signal created by the AND gate AND1. That is, the low-pass filter LPF1 removes a noise which (i) is contained in a voltage signal created by the AND gate AND1 and (ii) is caused during switching logical values. The voltage signal, thus smoothened by the low-pass filter LPF1, has a waveform as shown in (g) of FIG. 19. That is, the voltage signal, smoothened by the low-pass filter LPF1, becomes a voltage signal which is at a high level during the IDLE interval (an interval other than the DATA interval) and which is at a low level during an interval other than the IDLE interval. The voltage signal smoothened by the low-pass filter LPF1 is outputted, as an IDLE detection signal, outside (for example, outputted to the squelch circuit 62 and the auxiliary driver 64).

Note that, according to the second variation, a positive phase data signal is supplied to each of the noninverting input terminal of the first comparator Comp1 and the inverting input terminal of the second comparator Comp2. Instead of such a positive phase data signal, a negative phase can be supplied to each of the noninverting input terminal of the first comparator Comp1 and the inverting input terminal of the second comparator Comp2. This also makes it possible to obtain a voltage signal which is at a high level during an IDLE interval and which is at a low level during intervals other than the IDLE interval.

Note that the squelch circuit 62 and the auxiliary driver 64 can be configured to operate with reference to (i) an IDLE detection signal which is at a high level during the IDLE interval or (ii) an IDLE detection signal which is at a high level during an interval other than the IDLE interval. In a case where the squelch circuit 62 and the auxiliary driver 64 are configured to operate with reference to the latter IDLE detection signal, it is possible to employ, for example, the following configuration. That is, it is possible to employ a configuration in which an IDLE detection signal outputted from the IDLE detection circuit 61b is supplied, via an inverting amplifier, to each of the squelch circuit 62 and the auxiliary driver 64.

[Third Variation of IDLE Detection Circuit]

The following description will discuss, with reference to FIG. 20, a third variation of the IDLE detection circuit illustrated in FIG. 5. FIG. 20 is a circuit diagram illustrating a configuration of an IDLE detection circuit 61c in accordance with the third variation.

As illustrated in FIG. 20, the IDLE detection circuit 61c in accordance with the third variation includes, as with the IDLE detection circuit 61b illustrated in FIG. 18, a first comparator Comp1, a second comparator Comp2, and an AND gate AND1. Note, however, that an operating frequency of the AND gate AND1 is set to be sufficiently low (e.g., not greater than ¹/₁₀ times operating frequencies of the respective comparators Comp1 and Comp2) to an extent that a voltage signal to be created does not contain any spike noise which is caused during switching logical values. This eliminates the needs for providing, in the IDLE detection circuit 61c, a low-pass filter LPF1 for removing such a spike noise which is caused during switching logical values.

By comparing, with each of two reference voltages V0a and V0b, a positive phase data signal, each of the IDLE detection circuit 61b (see FIG. 18) and the IDLE detection circuit 61c (see FIG. 20) detects, as an IDLE interval, an interval during which a data signal falls within a range from a lower limit voltage V0a to a upper limit voltage V0b. The above method makes it possible to securely detect an IDLE interval regardless of a difference between an intermediate level of a data signal and a common voltage of the data signal. In compensation for the above method requiring more than one reference voltage source, the above method offers an advantage that the lower limit voltage of and the upper limit voltage of the predetermined range can be independently set. Particularly, it is to be noted that the IDLE detection circuit 61c illustrated in FIG. 20 does not include a low-pass filter LPF1. This causes the IDLE detection circuit 61c to offer a further advantage that its circuit configuration can be simplified as compared with the IDLE detection circuit 61b illustrated in FIG. 18.

[Supplemental Notes on IDLE Detection Circuit]

Note that each of the low-pass filters LPF1 in the IDLE detection circuit 61 (see FIG. 5) and the IDLE detection circuit 61b (see FIG. 18) can be replaced by a comparator. (a) of FIG. 21 is a circuit diagram illustrating a comparator Comp3 by which the low-pass filter LPF1 can be replaced. Each of (b) through (d) of FIG. 21 is a waveform chart of a voltage signal in each part of the comparator Comp3.

As with the low-pass filter LPF1, the comparator Comp3 smoothens a voltage signal created by the AND gate AND1. That is, the comparator Comp3 has a function of removing a noise which (i) is contained in a voltage signal created by the AND gate AND1 and (ii) is caused during switching logical values.

As illustrated in FIG. 21, a voltage signal, created by the AND gate AND1 and having a waveform as shown in (b) FIG. 21, is supplied to a noninverting input terminal of the comparator Comp3. The voltage signal thus supplied contains a noise which is caused during switching logical values. A reference voltage V3 is supplied to an inverting input terminal of the third comparator Comp3.

The comparator Comp3 compares the voltage signal created by the AND gate AND1 with the reference voltage V3, and then creates a voltage signal indicative of a comparison result. As illustrated in (c) of FIG. 21, the reference voltage V3 is set to be (i) smaller than an output voltage of the AND gate AND1 which is at a high level and (ii) greater than a peak voltage of a noise which is caused during switching logical values. The voltage signal created by the comparator Comp3 is as shown in (d) of FIG. 21. That is, as with the output signal of the low-pass filter LPF1, an output signal of the comparator Comp3 is at a high level during an IDLE interval and is at a low level during an interval other than the IDLE interval.

[Main Points]

As discussed above, an optical transmitter in accordance with an aspect of the present invention includes: a transmitting circuit configured to convert a data signal into an electric current signal, the data signal being a three-valued signal; and a light emitting element configured to convert the electric current signal into an optical signal, the transmitting circuit including an IDLE detection circuit which is configured to detect, as an IDLE interval, an interval during which the data signal falls within a predetermined range that is between a high level and a low level, the transmitting circuit being configured to control, during the IDLE interval, the electric current signal to be not greater than a threshold electric current of the light emitting element.

A method of transmitting light in accordance with an aspect of the present invention includes the steps of: (a) converting a data signal into an electric current signal, the data signal being a three-valued signal; and (b) converting the electric current signal into an optical signal with use of a light emitting element, the step (a) including the steps of: detecting, as an IDLE interval, an interval during which the data signal falls within a predetermined range that is between a high level and a low level; and controlling, during the IDLE interval, the electric current signal to be not greater than a threshold electric current of the light emitting element.

The above configuration makes it possible to keep the light emitting element turned off during an IDLE interval of a data signal supplied to the optical transmitter (i.e., an interval during which the data signal supplied to the optical transmitter is kept at an intermediate level that is between a high level and a low level). That is, during the IDLE interval of the data signal supplied to the optical transmitter, it is possible to control an optical signal (light intensity), which is to be supplied from the optical transmitter, to be at an off level. Note that the off level refers to a level which is different from each of a high level (the optical signal when the data signal is at the high level) and a low level (the optical signal when the data signal is at the low level) and which rarely fluctuate in response to external factor. Accordingly, by identifying an interval during which the optical signal supplied from the optical transmitter is at the off level, a receiver can correctly identify the IDLE interval of the data signal which has been supplied to the optical transmitter. Note that in the present specification, "turn-off" includes an aspect in which the light emitting element is caused to weakly emit light.

The optical transmitter in accordance with an aspect of the present embodiment is preferably configured such that the IDLE detection circuit includes: a first comparator configured to compare the data signal with an upper limit value of the predetermined range; a second comparator configured to compare the data signal with a lower limit value of the predetermined range; an AND gate configured to carry out logical multiplication with respect to an output of the first comparator and an output of the second comparator; and a low-pass filter configured to smoothen an output of the AND gate.

The above configuration makes it possible to (i) correctly identify an IDLE interval of a data signal supplied to the optical transmitter and (ii) create, at a high speed, an IDLE detection signal which has edges at a starting point and an end point of the IDLE interval thus identified.

The optical transmitter in accordance with an aspect of the present invention is preferably configured such that the transmitting circuit includes (i) a modulation driver configured to draw in a modulation electric current in accordance with the data signal and (ii) an auxiliary driver configured to draw in or draw out an auxiliary electric current during the IDLE interval; the light emitting element is a light emitting element in or out which a driving electric current flows, the driving electric current resulting from subtracting the auxiliary electric current from a sum of or a difference between a bias electric current and the modulation electric current; and the auxiliary electric current is set so that the driving electric current during the IDLE interval is not greater than the threshold electric current of the light emitting element. Particularly, the optical transmitter in accordance with an aspect of the present invention is preferably configured such that: the auxiliary driver is configured to draw in the auxiliary electric current during the IDLE interval; the light emitting element is a light emitting element in which the driving electric current flows, the driving electric current resulting from subtracting the auxiliary electric current from the difference between the bias electric current and the modulation electric current; and the auxiliary electric current is set so that a sum, during the IDLE interval, of the auxiliary electric current and the modulation electric current is not smaller than the bias electric current.

With the above configuration, it is possible to (i) promptly turn off the light emitting element at a starting point of an IDLE interval of a data signal supplied to the optical transmitter and (ii) promptly turn on the light emitting element at an end point of the IDLE interval of the data signal supplied to the optical transmitter. Particularly, a delay time from the starting point/end point of the IDLE interval to turning off/on of the light emitting element becomes shorter as compared with a case where the light emitting element is turned off/on by cutting off/releasing cut-off of a bias electric current.

The optical transmitter in accordance with an aspect of the present invention is preferably configured such that the auxiliary electric current is set so that the sum, during the IDLE interval, of the auxiliary electric current and the modulation electric current is greater than the bias electric current; and the transmitting circuit further includes a compensating electric current source configured to supply the auxiliary driver with a compensating electric current which compensates for an insufficiency of the bias electric current, in a case where the sum of the modulation electric current and the auxiliary electric current exceeds the bias electric current.

In a case where the compensating electric current source is not provided, an insufficiency of the bias electric current occurs during the IDLE interval. This causes a drop in voltage at the output terminal of the transmitting circuit. This can ultimately cause an obstacle to operations of the modulation driver and the auxiliary driver. The above configuration, however, compensates for the insufficiency during the IDLE interval by the compensating electric current. This will never cause any obstacle to operations of the modulation driver and the auxiliary driver due to a drop in voltage caused at the output terminal of the transmitting circuit.

The optical transmitter in accordance with an aspect of the present invention is preferably configured such that: the modulation driver includes (i) a pre-driver configured to amplify the data signal and (ii) a main driver configured to convert, into the electric current signal, the data signal amplified by the pre-driver.

In order to control an electric current signal, to be supplied from the main driver, to have a given amplitude without distorting the electric current signal, it is necessary to control a data signal, to be supplied to the main driver, to have a given amplitude (electric potential difference between a high level and a low level). The above configuration makes it possible to control, with use of the pre-driver, a data signal, to be supplied to the main driver, to have a given amplitude. It is therefore possible to control an electric current signal, to be supplied from the main driver, to have a given amplitude without distorting the electric current signal. This makes it possible to control an optical signal, to be supplied from the light emitting element, to have a given amplitude (light intensity difference between a high level and a low level) without distorting the optical signal.

The optical transmitter in accordance with an aspect of the present invention is preferably configured such that the modulation driver further includes (i) a voltage dropping device provided between a power source and the pre-driver and (ii) a control circuit configured to control an amount of a voltage drop, caused by the voltage dropping device, in accordance with an output voltage of the pre-driver.

The above configuration prevents the output voltage of the pre-driver from fluctuating in response to a fluctuation in power source voltage of the pre-driver. This eliminates the need for imposing strict conditions on a fluctuation range of the power source voltage of the pre-driver so that an operating condition of each constituent of the main driver is prevented from being not met.

The optical transmitter in accordance with an aspect of the present invention is configured such that the auxiliary driver includes (i) a pre-driver configured to amplify an IDLE detection signal indicative of the IDLE interval and (ii) a main driver configured to convert, into the electric current signal, the IDLE detection signal amplified by the pre-driver.

The above configuration makes it possible to control an electric current, to be drawn in, to have a given value even in a case where the IDLE detection signal has a small amplitude (electric potential difference between a high level and a low level).

The optical transmitter in accordance with an aspect of the present invention is preferably configured such that the auxiliary driver further includes (i) a voltage dropping device provided between a power source and the pre-driver and (ii) a control circuit configured to control a voltage drop, caused by the voltage dropping device, in accordance with an output voltage of the pre-driver.

The above configuration prevents the output voltage of the pre-driver from fluctuating in response to a fluctuation in power source voltage of the pre-driver. This eliminates the need for imposing strict conditions on a fluctuation range of the power source voltage of the pre-driver so that an operating condition of each constituent of the main driver is prevented from being not met.

The optical transmitter in accordance with an aspect of the present invention is preferably configured such that the bias electric current is created by a bias electric current source which is a first bias electric current source or a second bias electric current source, the first bias electric current source including (i) a first current mirror circuit which is composed of a pair of transistors and (ii) a first direct current source which is connected to an input point of the first current mirror circuit, the second bias electric current source including (i) a second current mirror circuit which is composed of an operational amplifier, a transistor, and a pair of resistors and (ii) a second direct current source which is connected to an input point of the second current mirror circuit.

The above configuration makes it possible to reduce a fluctuation of the bias electric current to be supplied, as compared with a configuration in which the bias electric current is supplied from the direct current source without passing through the current mirror circuit.

The optical transmitter in accordance with an aspect of the present invention is preferably configured such that: the bias electric current is created by a bias electric current source which includes a first bias electric current source and a second bias electric current source, the first bias electric current source including (i) a first current mirror circuit which is composed of a pair of transistors and (ii) a first direct current source which is connected to an input point of the first current mirror circuit; and the second bias electric current source including (i) a second current mirror circuit which is composed of an operational amplifier, a transistor, and a pair of resistors and (ii) a second direct current source which is connected to an input point of the second current mirror circuit, in a case where a data signal to be transmitted is an intermittent signal, the first bias electric current source being employed as the bias electric current source, in a case where the data signal to be transmitted is a continuous signal, the second bias electric current source being employed as the bias electric current source.

According to the above configuration, the first bias electric current source is suitable for both of transmission of a continuous signal and transmission of an intermittent signal such as an OOB signal because the first bias electric current source operates without being affected by a fluctuation in output voltage. In contrast, the second bias electric current source can further reduce a fluctuation in bias electric current to be supplied as compared with the first bias electric current source although the second bias electric current source is not suitable for transmission of an intermittent signal. As such, the above configuration makes it possible to (i) transmit both of an intermittent signal and a continuous signal and, when a continuous signal is to be transmitted, (ii) further reduce a fluctuation in bias electric current to be supplied.

The optical transmitter in accordance with an aspect of the present invention is preferably configured such that the compensating electric current source includes (i) a diode having an anode terminal connected to a clamp power source, (ii) an npn transistor having a base terminal connected to the clamp power source, or (iii) an NMOS transistor having a gate terminal connected to the clamp power source.

The above configuration makes it possible to realize the compensating electric current source by a simple configuration.

The optical transmitter in accordance with an aspect of the present invention is preferably configured such that the compensating electric current source includes a voltage follower circuit connected to a clamp power source, and one of (i) an npn transistor having a base terminal which is connected to the clamp power source via the voltage follower circuit and (ii) an NMOS transistor having a gate terminal which is connected to the clamp power source via the voltage follower circuit.

The above configuration makes it possible to realize the compensating electric current source by a simple configuration.

The optical transmitter in accordance with an aspect of the present invention is preferably configured such that the transmitting circuit includes (i) a modulation driver configured to draw in a modulation electric current in accordance with the data signal and (ii) an auxiliary driver configured to draw in or draw out an auxiliary electric current during the IDLE interval; the light emitting element is a light emitting element in or out which a driving electric current flows, the driving electric current resulting from subtracting the auxiliary electric current from a sum of or a difference between a bias electric current and the modulation electric current; and the auxiliary electric current is set so that the driving electric current during the IDLE interval is not greater than the threshold electric current of the light emitting element. Particularly, the optical transmitter in accordance with an aspect of the present invention is preferably configured such that the auxiliary driver is configured to draw out the auxiliary electric current during the IDLE interval; the light emitting element is a light emitting element which flows out the driving electric current resulting from subtracting the auxiliary electric current from the sum of the bias electric current and the modulation electric current; and the auxiliary electric current is set to be not smaller than the bias electric current.

With the above configuration, it is possible to (i) promptly turn off the light emitting element at a starting point of an IDLE interval of a data signal supplied to the optical transmitter and (ii) promptly turn on the light emitting element at an end point of the IDLE interval of the data signal supplied to the optical transmitter. Particularly, a delay time from the starting point/end point of the IDLE interval to turning off/on of the light emitting element becomes shorter as compared with a case where the light emitting element is turned off/on by cutting off/releasing cut-off of a bias electric current.

The optical transmitter in accordance with an aspect of the present invention is preferably configured such that the auxiliary electric current is set so that the sum, during the IDLE interval, of the auxiliary electric current and the modulation electric current is greater than the bias electric current; and the transmitting circuit further includes a compensating electric current source configured to supply the auxiliary driver with a compensating electric current which compensates for an insufficiency of the bias electric current, in a case where the sum of the modulation electric current and the auxiliary electric current exceeds the bias electric current.

In a case where the compensating electric current source is not provided, an insufficiency of the bias electric current occurs during the IDLE interval. This causes a drop in voltage at the output terminal of the transmitting circuit. This can ultimately cause an obstacle to operations of the modulation driver and the auxiliary driver. The above configuration, however, compensates for the insufficiency during the IDLE interval by the compensating electric current. This will never cause any obstacle to operations of the modulation driver and the auxiliary driver due to a drop in voltage caused at the output terminal of the transmitting circuit.

Note that an active optical cable including a connector in which the optical transmitter is provided is also encompassed in an aspect of the present invention.

The optical transmitter in accordance with an aspect of the present invention is preferably configured such that the IDLE detection circuit includes (i) a first comparator configured to identify a first interval during which the data signal is not smaller than a lower limit value of the predetermined range and (ii) a second comparator configured to identify a second interval during which the data signal is not greater than an upper limit value of the predetermined range; and the IDLE detection circuit detects, as the IDLE interval, an interval during which the first interval and the second interval overlap each other.

The above configuration makes it possible to (i) correctly identify a starting point and an end point of an IDLE interval of a data signal supplied to the optical transmitter and (ii) create an IDLE detection signal which has edges at the starting point and the end point of the IDLE interval thus identified.

The optical transmitter in accordance with an aspect of the present invention is preferably configured such that the first comparator is configured to identify the first interval by comparing the data signal with a reference voltage; and the second comparator is configured to identify the second interval by comparing, with the reference voltage, a negative phase signal of the data signal.

The above configuration requires a single reference voltage source only. Note that the above configuration is suitable for a case where the data signal is provided through a differential signaling method because it identifies an IDLE interval of the data signal with use of a positive phase data signal and a negative phase data signal.

The optical transmitter in accordance with an aspect of the present invention is preferably configured such that the first comparator is configured to identify the first interval by comparing the data signal with a first reference voltage; and the second comparator is configured to identify the second interval by comparing the data signal with a second reference voltage.

The above configuration makes it possible to independently set a lower limit value and an upper limit value of the predetermined range. Note that the above configuration is suitable for a case where the data signal is provided through a single-end method because it identifies an IDLE interval of the data signal with use of a positive phase data signal or a negative phase data signal.

The optical transmitter in accordance with an aspect of the present invention is preferably configured such that the IDLE detection circuit further includes an AND gate which carries out logical multiplication with respect to an output of the first comparator and an output of the second comparator.

The above configuration makes it possible to create, at a higher speed, an IDLE detection signal which has edges at the starting point and the end point of the IDLE interval identified, as compared with a case where a peak hold circuit as disclosed in Patent Literature 5 is employed.

The optical transmitter in accordance with an aspect of the present invention is preferably configured such that the IDLE detection circuit further includes a low-pass filter which is configured to smoothen an output of the AND gate.

The above configuration makes it possible to remove a spike noise which is caused during switching logical values and which can be contained in an IDLE detection signal created by the AND gate.

The optical transmitter in accordance with an aspect of the present invention is preferably configured such that the IDLE detection circuit further includes a comparator which is configured to smoothen an output of the AND gate.

The above configuration makes it possible to remove a spike noise which is caused during switching logical values and which can be contained in an IDLE detection signal created by the AND gate.

[Supplementary Information]

The present invention is not limited to the description of the embodiments above, but can be altered by a skilled person within the scope of the claims. An embodiment based on a proper combination of technical means disclosed in different embodiments is encompassed in the technical scope of the present invention.

For example, according to an embodiment of the present invention, the driving electric current, which is supplied to the light emitting element during the IDLE interval, is controlled to be not greater than the threshold electric current by the auxiliary driver. The present invention is, however, not limited as such. Alternatively, in a case of, for example, an optical transmitter in which a difference, which results from subtracting (i) a modulation electric current drawn by the modulation driver from (ii) a bias electric current supplied from the bias electric current source, is supplied as a driving electric current to the light emitting element, it is possible to control the driving electric current, which is supplied to the light emitting element, to be not greater than the threshold electric current even by halting operations of the bias electric current source and the modulation driver. The optical transmitter in which the above control is carried out during an IDLE interval is also encompassed in the scope of the present invention.

INDUSTRIAL APPLICABILITY

The present invention is suitably applicable to an optical transmitter for transmitting a data signal which includes an OOB pattern or the like. Particularly, the present invention contributes to realization of an optical transmitter which is in conformity to a communication standard, such as SAS 2.0 or PCIe 3.0, which requires a metal cable.

REFERENCE SIGNS LIST

1 Active optical cable
2 Connector
3 Connector
4 Cable
5 AC coupling capacitor
6 Transmission circuit
7 LD
8 PD
9 Receiving circuit
10 AC coupling capacitor
11 Optical fiber
61 IDLE detection circuit
62 Squelch circuit
63 Modulation driver
64 Auxiliary driver
65 Bias electric current source
66 Compensating electric current source
A Modulation electric current
B Auxiliary current
C Bias electric current
D Compensating electric current
E Driving electric current

The invention claimed is:

1. An optical transmitter, comprising:
a modulation driver configured to draw in a modulation electric current in accordance with a data signal;
an auxiliary driver configured to draw in or draw out an auxiliary electric current during a no-signal interval of the data signal; and
a light emitting element in or out which a driving electric current flows, the driving electric current resulting from subtracting the auxiliary electric current from a sum of or a difference between a bias electric current and the modulation electric current,
the auxiliary electric current being set so that the driving electric current during the no-signal interval is not greater than a threshold electric current of the light emitting element.

2. The optical transmitter as set forth in claim 1, wherein:
the auxiliary driver is configured to draw in the auxiliary electric current during the no-signal interval;
the light emitting element is a light emitting element in which the driving electric current flows, the driving electric current resulting from subtracting the auxiliary electric current from the difference between the bias electric current and the modulation electric current; and
the auxiliary electric current is set so that a sum, during the no-signal interval, of the auxiliary electric current and the modulation electric current is not smaller than the bias electric current.

3. The optical transmitter as set forth in claim 2, wherein:
the auxiliary electric current is set so that the sum, during the no-signal interval, of the auxiliary electric current and the modulation electric current is greater than the bias electric current; and
the optical transmitter further includes a compensating electric current source configured to draw out a compensating electric current which compensates for an insufficiency of the bias electric current, in a case where the sum of the modulation electric current and the auxiliary electric current exceeds the bias electric current.

4. The optical transmitter as set forth in claim 2, wherein:
the data signal has a pattern composed of (i) a DATA interval during which the data signal is at a high level or a low level and (ii) an IDLE interval during which the data signal is kept at an intermediate level that is between the high level and the low level; and
the no-signal interval is the IDLE interval.

5. The optical transmitter as set forth in claim 4, wherein:
the auxiliary driver includes (i) a pre-driver configured to amplify an IDLE detection signal indicative of the IDLE interval and (ii) a main driver configured to switch between drawing in the auxiliary electric current and not drawing in the auxiliary electric current, in accordance with the IDLE detection signal amplified by the pre-driver.

6. The optical transmitter as set forth in claim 5, wherein:
the auxiliary driver further includes (i) a voltage dropping device provided between a power source and the pre-driver and (ii) a control circuit configured to control a voltage drop, caused by the voltage dropping device, in accordance with an output voltage of the pre-driver.

7. The optical transmitter as set forth in claim 1, wherein:
the auxiliary driver is configured to draw out the auxiliary electric current during the no-signal interval;
the light emitting element is a light emitting element out which the driving electric current flows, the driving electric current resulting from subtracting the auxiliary electric current from the sum of the bias electric current and the modulation electric current; and
the auxiliary electric current is set to be not smaller than the bias electric current.

8. The optical transmitter as set forth in claim 7, wherein:
the auxiliary electric current is set to be greater than the bias electric current; and
the optical transmitter further includes a compensating electric current source configured to draw out a compensating electric current which compensates for an insufficiency of the bias electric current, in a case where the auxiliary electric current exceeds the bias electric current.

9. The optical transmitter as set forth in claim 1, wherein:
the light emitting element is a cathode-grounded light emitting element in which the driving electric current flows, the driving electric current resulting from subtracting the auxiliary electric current from the difference between the bias electric current and the modulation electric current.

10. The optical transmitter as set forth in claim 3, wherein:
the compensating electric current source includes a diode or transistor connected to a clamp power source and the light emitting element.

11. The optical transmitter as set forth in claim 8, wherein:
the compensating electric current source includes a diode or transistor connected to a clamp power source and the light emitting element.

12. An active optical cable comprising:
a cable which houses an optical fiber; and
a pair of connectors provided at respective ends of the cable,
one or both of the pair of connectors including an optical transmitter recited in claim 1.

13. An ONU (Optical Network Unit) constituting a PON (Passive Optical Network), comprising an optical transmitter recited in claim 1.

14. A method of transmitting light, comprising the steps of:
(a) drawing in a modulation electric current in accordance with a data signal;
(b) drawing in or drawing out an auxiliary electric current during a no-signal interval of the data signal; and
(c) causing a driving electric current to flow in or out a light emitting element, the driving electric current resulting from subtracting the auxiliary electric current from a sum of or a difference between a bias electric current and the modulation electric current,
the auxiliary electric current being set so that the driving electric current during the no-signal interval is not greater than a threshold electric current of the light emitting element.

* * * * *